(12) United States Patent
Nonoyama et al.

(10) Patent No.: US 11,917,764 B2
(45) Date of Patent: Feb. 27, 2024

(54) TAPE AUTOLOADING DEVICE

(71) Applicant: FUJI CORPORATION, Chiryu (JP)

(72) Inventors: Kazushi Nonoyama, Toyota (JP); Satoshi Imanishi, Okazaki (JP); Daisuke Suzuki, Chiryu (JP); Masami Kawabata, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 789 days.

(21) Appl. No.: 16/981,579

(22) PCT Filed: Apr. 12, 2018

(86) PCT No.: PCT/JP2018/015422
§ 371 (c)(1),
(2) Date: Sep. 16, 2020

(87) PCT Pub. No.: WO2019/198207
PCT Pub. Date: Oct. 17, 2019

(65) Prior Publication Data
US 2021/0076548 A1 Mar. 11, 2021

(51) Int. Cl.
*H05K 13/04* (2006.01)
*B65H 3/12* (2006.01)
*H05K 13/02* (2006.01)

(52) U.S. Cl.
CPC ......... *H05K 13/0419* (2018.08); *B65H 3/128* (2013.01); *H05K 13/02* (2013.01)

(58) Field of Classification Search
CPC . H05K 13/0419; H05K 13/02; H05K 13/0417
See application file for complete search history.

(56) References Cited

U.S. PATENT DOCUMENTS

2017/0174453 A1 6/2017 Akai et al.

FOREIGN PATENT DOCUMENTS

| JP | 2009-84004 A | 4/2009 |
| JP | 2017-109839 A | 6/2017 |

(Continued)

OTHER PUBLICATIONS

WO-2016203628-A1 English translation (Year: 2016).*
International Search Report dated Jul. 3, 2018 in PCT/JP2018/015422 filed on Apr. 12, 2018, 2 pages.

*Primary Examiner* — Jason L Vaughan
*Assistant Examiner* — Amanda Kreiling
(74) *Attorney, Agent, or Firm* — Oblon, McClelland, Maier & Neustadt, L.L.P.

(57) ABSTRACT

A tape autoloading device includes a tape leading-end processing device, which forms the leading end of a carrier tape into a predetermined shape, and a transfer device, which carries the carrier tape in a first direction different from the tape longitudinal direction and transfers the carrier tape to the next step. Tape leading-end processing device includes a feeding device for conveying the carrier tape along a conveyance path formed in a groove in a guide member, a pressing device for pressing the upper surface of the carrier tape, and a cutting device for cutting the leading-end of the carrier tape. The transfer device includes a guide device for guiding the carrier tape having a leading end formed into a predetermined shape, a gripping device for gripping the leading end of the carrier tape, and a moving device for moving the carrier tape in the first direction.

11 Claims, 19 Drawing Sheets

(56) References Cited

FOREIGN PATENT DOCUMENTS

| | | |
|---|---|---|
| JP | 2017-165543 A | 9/2017 |
| WO | WO 2014/097473 A1 | 6/2014 |
| WO | WO 2016/203628 A1 | 12/2016 |
| WO | WO-2016203628 A1 * | 12/2016 ............. B26D 1/305 |

* cited by examiner

TAPE AUTOLOADING DEVICE

TECHNICAL FIELD

The present specification relates to a tape autoloading device.

BACKGROUND ART

Conventionally, there has been known a tape autoloading device for loading a carrier tape into a tape feeder, the carrier tape having a cover tape affixed to a base tape (see, for example, Patent Literature 1). The carrier tape has a base tape, provided with accommodating portions for accommodating components, and a cover tape for blocking the accommodating portions. The cover tape is affixed to the base tape in a peelable manner in order to allow the components accommodated in the accommodating portions to be taken out. The carrier tape is wound on a tape reel that can be installed in the tape feeder. The tape feeder draws the carrier tape from the installed tape reel and peels off the cover tape from the base tape of the carrier tape so that the components in the accommodating portions can be picked up at the component pickup position. Further, the tape feeder feeds the cover tape peeled off from the base tape in a predetermined path and discharges the cover tape out of the tape feeder.

The tape autoloading device includes a tape leading-end processing device, a temporary tape routing device, and a connecting device. The tape leading-end processing device is a device for forming the leading end of the carrier tape into a predetermined shape, the carrier tape having been inserted into a tape inlet of the tape autoloading device. Carrier tape whose leading end has been processed by the tape leading-end processing device is conveyed out and transferred to the next step by a transfer device. The temporary tape routing device is a device that routes and holds temporary tape in place along a path that follows the predetermined path of the tape feeder. The temporary tape is an extension tape, different from the cover tape that is peeled off from the base tape, and is coupled to the leading end of the cover tape in order to route the cover tape along a path that follows the predetermined path to a discharge outlet.

The connecting device has a heating element. The connecting device is a device for coupling the temporary tape, held by the temporary tape routing device, to the leading end of the cover tape by using heat treatment with a heating member to melt adhesive remaining on the peeled off surface of the cover tape of the carrier tape, the cover tape having a leading end that has been processed by the tape leading-end processing device. Coupling by the connecting device is performed while the leading end of the cover tape peeled from the base tape and the temporary tape are overlapped in between a tape retaining member and a heating member. After the coupling by the above-described connecting device is performed, the temporary tape affixed to the leading end of the cover tape is transferred from the temporary tape routing device to the tape feeder, and then the cover tape is routed along a path that follows the predetermined path to the discharge outlet.

PATENT LITERATURE

Patent Literature 1: WO 2014/097473

BRIEF SUMMARY

Technical Problem

In the tape autoloading device described above, the carrier tape, having a leading end formed into a predetermined shape by the tape leading-end processing device, is conveyed out in a direction perpendicular to the tape longitudinal direction by the transfer device. As this occurs, the carrier tape (especially the embossed carrier tape) sags downward around the middle in the longitudinal direction of the tape. At the same time, the tape leading-end processing device has a guide member, such as a side wall for restricting the width direction of the carrier tape, and a feeding device, such as a sprocket, in order to process the leading end of the carrier tape. Therefore, when the carrier tape as described above is conveyed out in a direction perpendicular to the tape longitudinal direction, the lower portion of the carrier tape sagging downward is easily caught in the guide member, the sprocket, and the like of the tape leading-end processing device, causing the carrier tape to be easily damaged.

It is an object of the present specification to provide a tape autoloading device capable of suppressing the carrier tape from getting caught when the carrier tape, having a leading end formed into a predetermined shape, is conveyed out in a direction different from the tape longitudinal direction.

Solution to Problem

The present specification provides a tape autoloading device, comprising: a tape leading-end processing device configured to form the leading end of a carrier tape into a predetermined shape, the carrier tape comprising a base tape, provided with accommodation holes configured to contain components, and a cover tape, configured to adhere to the top face of the base tape; and a transfer device configured to convey out the carrier tape in a first direction different from the tape longitudinal direction and transfer the carrier tape to a next step, the carrier tape having a leading end formed into the predetermined shape; the tape leading-end processing device comprising: a feeding device configured to convey the carrier tape along a conveyance path, formed as a groove in a guide member, extending in a straight line from a tape inlet to a predetermined processing position; a pressing device configured to press on the top surface of the carrier tape conveyed along the conveyance path; and a cutting device configured to cut the leading end of the carrier tape conveyed along the conveyance path; wherein the transfer device comprises: a guide device configured to guide the carrier tape whose leading end is formed into the predetermined shape; a gripping device configured to grip the leading end of the carrier tape guided by the guide device; and a moving device configured to move the carrier tape, the leading end of which being gripped by the gripping device, in the first direction; and wherein the tape autoloading device comprises a lift-up device which is configured to lift up the carrier tape above the upper edge of the side walls of the guide member, the carrier tape extending along the conveyance path and being lifted up before moving to the first direction by the moving device.

According to the present disclosure, after the leading end of the carrier tape is formed in a predetermined shape by the tape leading-end processing device but before the carrier tape is conveyed out and transferred to the next step in a first direction different from the tape longitudinal direction, the carrier tape extending along the conveyance path is lifted above the upper edge of the side walls of the guide member by the lift-up device. Therefore, when the carrier tape is conveyed out in the first direction different from the tape longitudinal direction by the transfer device, it is possible to prevent the carrier tape from being interfered with and getting caught by structures surrounding the conveyance path.

DESCRIPTION OF EMBODIMENTS

Figure 1:
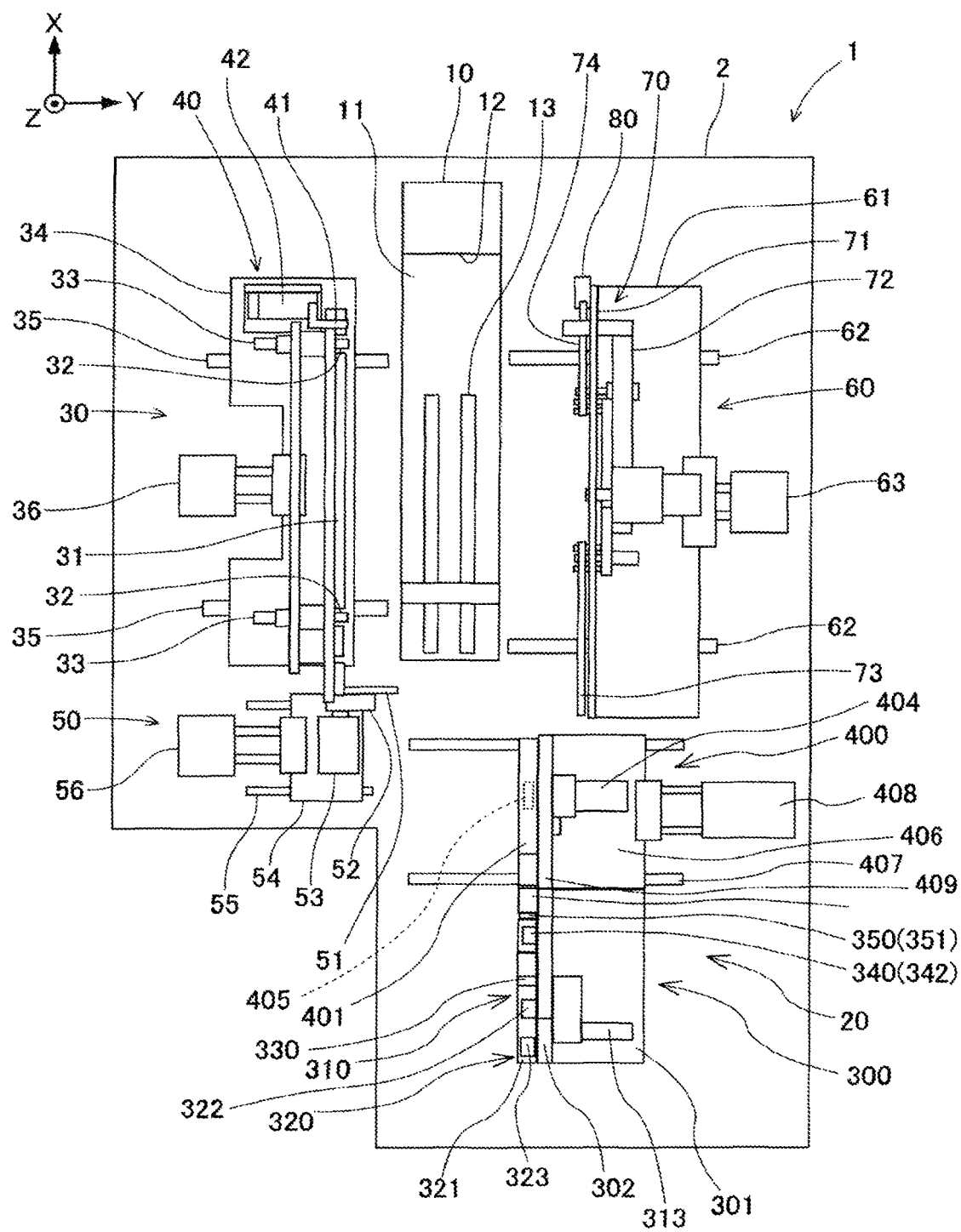
FIG. 1 A schematic top view of a tape autoloading device of an embodiment.

Tape autoloading device 1 of the embodiment will be described with reference to the drawings. Tape autoloading device 1 is a device for automatically loading carrier tape 200 into tape feeder 100. Specifically, tape autoloading device 1 is a device for loading the leading end of carrier tape 200, wound around a tape reel, into tape feeder 100, after having been processed in a manner in which carrier tape 200 can be loaded into tape feeder 100, and, at the same time, routes the cover tape peeled off from carrier tape 200 in a predetermined path. Tape autoloading device 1 includes, as shown in FIG. 1, feeder holding stand 10, automatic tape processing device 20, tape conveyance device 30, first release device 40, second release device 50, and cover tape processing device 60.

Figure 2:
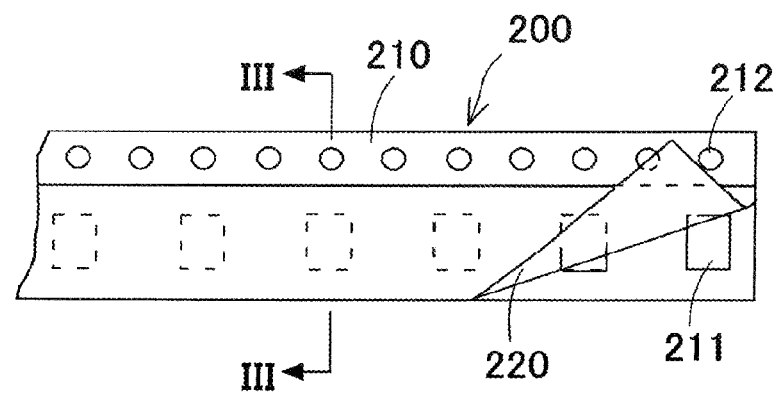
FIG. 2 A top view of a carrier tape.
Figure 3:
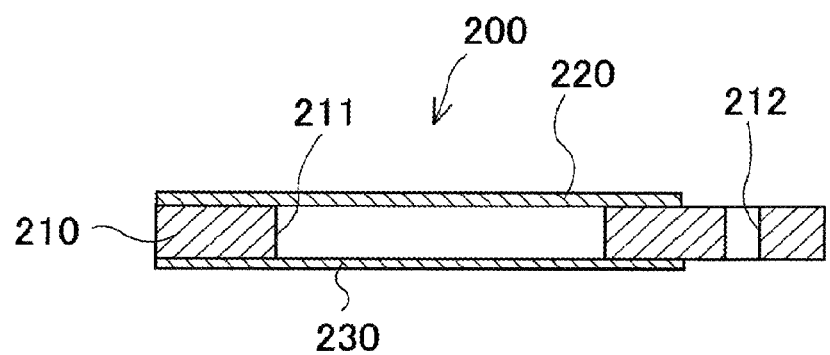
FIG. 3 A sectional view along III-III of the carrier tape shown in FIG. 2.
Figure 4:
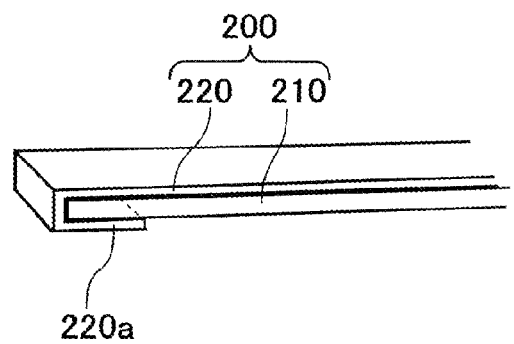
FIG. 4 A perspective view showing the shape of the leading end of the carrier tape.

First, the configuration of carrier tape 200 will be described with reference to FIGS. 2 to 4. Carrier tape 200 is a tape member for accommodating multiple components in a row in the longitudinal direction. As shown in FIGS. 2 and 3, carrier tape 200 includes base tape 210 and cover tape 220. Base tape 210 is made of a flexible material such as paper material or resin. Base tape 210 is provided with accommodation holes 211. Accommodation holes 211 are accommodating portions capable of accommodating components. Accommodation holes 211 are provided at intervals, having a predetermined pitch, along the longitudinal direction of base tape 210. The components may be electronic components or the like that are mounted on boards and may be, for example, micro components of 0201 size (0.2 mm×0.1 mm).

Carrier tape 200 may be such that accommodation holes 211 penetrate base tape 210 or may be of an embossed type in which accommodation holes 211 are depressed into base tape 210 without penetrating base tape 210. Additionally, in the case of carrier tape 200 having a structure in which accommodation holes 211 penetrate base tape 210 shown in FIG. 3, carrier tape 200 further has bottom tape 230 that is adhered to the lower face of base tape 210 to hold and prevent components accommodated in accommodation holes 211 from falling out. Bottom tape 230 is made of a transparent or translucent paper material, a polymer film, or the like.

Engagement holes 212 are provided in base tape 210 so as to penetrate base tape 210. Engagement holes 212 are feed holes which engage with engagement protrusions of a sprocket, which will be described later. Engagement holes 212 have a substantially circular or elliptical shape. Engagement holes 212 have a size allowing engagement with engagement protrusions of the sprocket, which will be described later. Engagement holes 212 are provided at intervals, having a predetermined pitch, along the longitudinal direction of base tape 210. Accommodation holes 211 described above are disposed in a single row along the longitudinal direction of base tape 210 on one side in the width direction of base tape 210. Further, engagement holes 212 described above are disposed in a single row along the longitudinal direction of base tape 210 on the other side of base in the width direction of tape 210.

Cover tape 220 is adhered to the upper face of base tape 210 with an adhesive (where portions constituted by engagement holes 212 may be excluded). Cover tape 220 is adhered to base tape 210 at both sides in the width direction of carrier tape 200 while avoiding the position, in the width direction, of accommodation holes 211. Cover tape 220 has a function of blocking the upper portion of accommodation holes 211 of base tape 210 and preventing components accommodated in accommodation holes 211 from flying out. Cover tape 220 is made of a transparent polymer film or the like.

When tape feeder 100 is loaded after being pulled out from the tape reel, carrier tape 200 is cut so that the leading end of cover tape 220 protrudes from leading end of base tape 210 by a predetermined length. Then, as shown in FIG. 4, carrier tape 200 is processed so that protruding portion 220a of cover tape 220 is folded back toward the underside face at the leading end of base tape 210. Carrier tape 200 is cut, for example, so that the distance from the leading end of base tape 210 to the first component accommodated in accommodation hole 211 becomes a predetermined length (e.g., 20 mm) and the length of protrusion 220a of cover tape 220 from the leading end of base tape 210 becomes a predetermined length (e.g., 40 mm).

Next, the configuration of tape feeder 100 will be described with reference to FIGS. 5 to 7. Tape feeder 100 is a device for supplying a component, to be mounted on a board, to component pickup position L by conveying carrier tape 200. Tape feeder 100 is removably installed in a slot of a component mounting machine provided on a board production line that produces a board. Components supplied from tape feeder 100 to component suction position L are picked up by a suction nozzle or the like attached to the mounting head of the component mounting machine and then mounted on the board by release of suction or the like.

Figure 5:
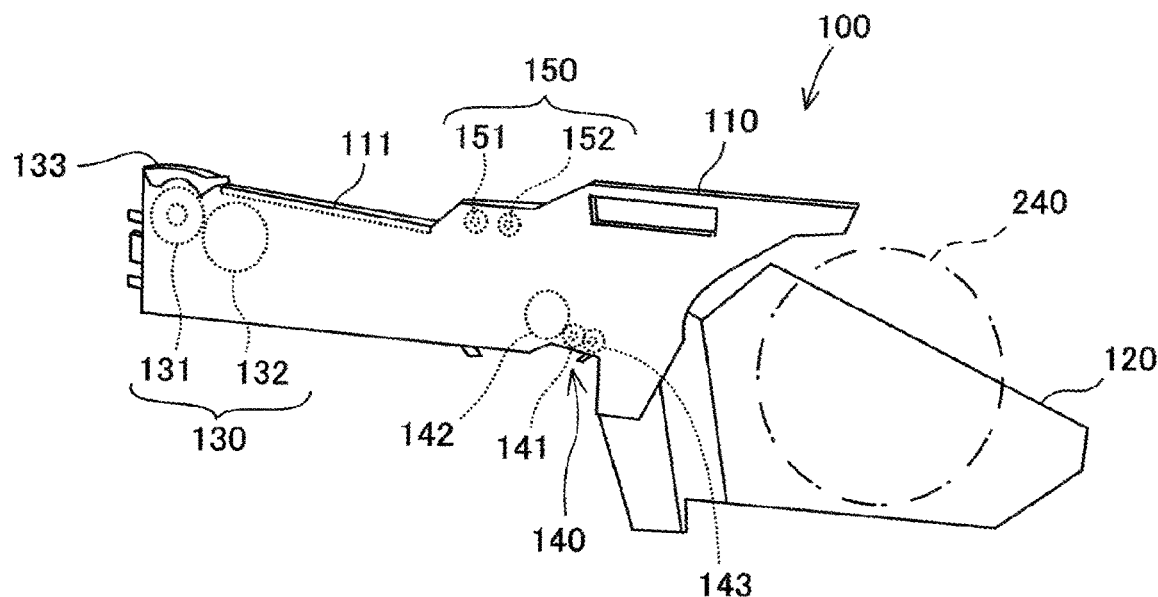
FIG. 5 A schematic perspective view of a tape feeder for conveying the carrier tape.

Tape feeder 100, as shown in FIG. 5, has feeder main body 110, reel accommodating portion 120, and tape feeding mechanism 130. Feeder main body 110 has a flat box shape. Feeder main body 110 has tape feed guide 111. Tape feed guide 111 is provided on the upper portion of feeder main body 110. Reel accommodating portion 120 is disposed on the rear end side of feeder main body 110. Reel accommodating portion 120 accommodates disk-shaped tape reel 240 on which carrier tape 200 is wound. Carrier tape 200 is pulled out from tape reel 240 accommodated in reel accommodating portion 120 and guided by tape feed guide 111. Tape feed guide 111 forms a tape path for guiding carrier tape 200 between reel accommodating portion 120 and tape feeding mechanism 130.

Tape feeding mechanism 130 is disposed at the front end of feeder main body 110. Tape feeding mechanism 130 is a mechanism for pitch-feeding carrier tape 200 drawn from tape reel 240. Tape feeding mechanism 130 includes sprocket 131, motor 132, and first tape holding portion 133. Tape feeding mechanism 130 need not be only at the front end of feeder main body 110, but may also be disposed at the rear end of feeder main body 110.

Sprocket 131 is a disk-shaped member provided below the tape conveyance path in feeder main body 110. Sprocket 131 is rotatably mounted at the front end of feeder main body 110. Sprocket 131 rotates in a direction that conveys carrier tape 200 guided by tape feed guide 111. Sprocket 131 has engagement protrusions which are outer teeth protruding radially outward on the outer peripheral surface. The engagement protrusions are provided at every predetermined angle over the entire periphery thereof.

Motor 132 is coupled to sprocket 131 via a gear. Motor 132 is a servomotor for rotating sprocket 131. When motor 132 is driven to rotate, the rotation is transmitted to sprocket 131 using the gear, while sprocket 131 is decelerated, thereby causing sprocket 131 to rotate. Motor 132 is driven such that sprocket 131 rotates intermittently. When sprocket 131 rotates, the engagement protrusions engage with engagement holes 212 of carrier tape 200 guided by tape feed guide 111 so that carrier tape 200 is conveyed in the direction along the tape longitudinal direction (hereinafter referred to as conveyance direction X). Carrier tape 200 is conveyed incrementally, with each increment having a predetermined pitch.

First tape holding portion 133 is a portion at which carrier tape 200 is held in place, carrier tape 200 being where engagement protrusions of sprocket 131 engage with engagement holes 212. First tape holding portion 133 covers the upper face of carrier tape 200 from above. An opening hole is provided on the upper face of first tape holding portion 133 in addition to a window hole. Sprocket 131 is placed such that the engagement protrusions reaching near the upper end protrude to the tape conveyance path through the window hole. The engagement protrusions engage with engagement holes 212 of carrier tape 200 such that the engagement protrusions protrude above the tape conveyance path. The opening hole is provided at component pickup position L.

Figure 6:
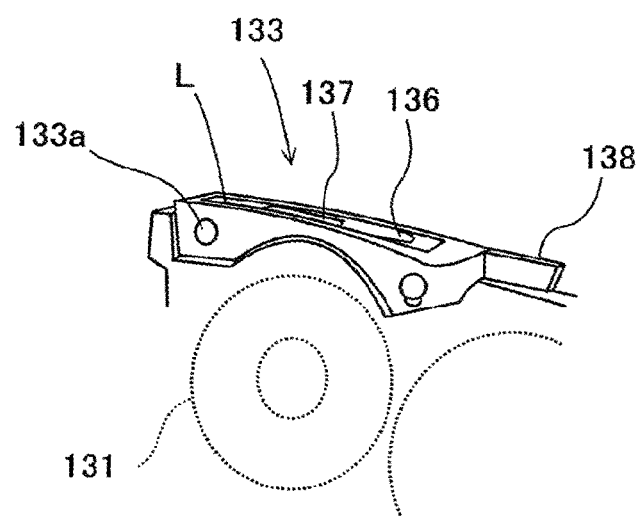
FIG. 6 An enlarged perspective view of the distal end of the tape feeder.
Figure 7:
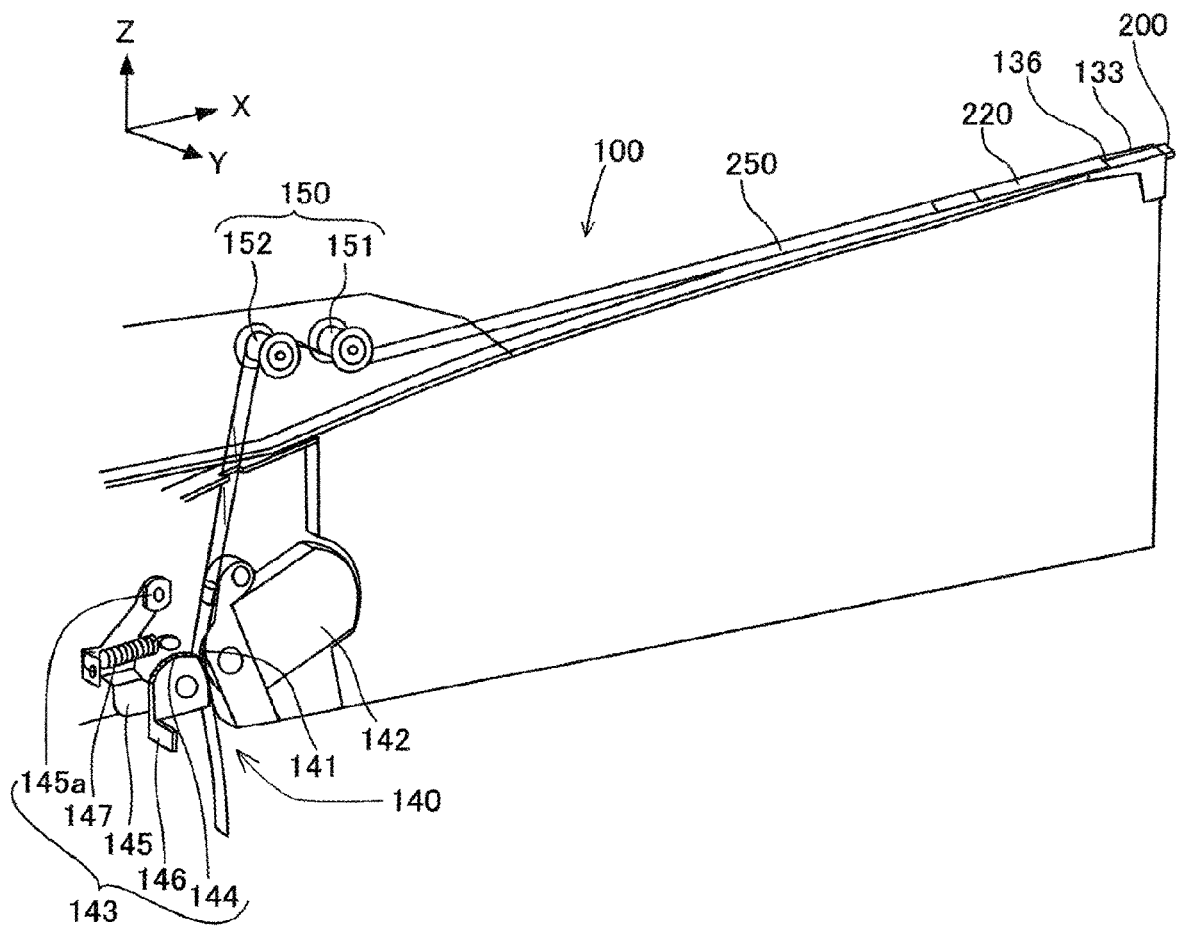
FIG. 7 A perspective view showing a state in which the carrier tape and the temporary tape are loaded into the tape feeder.

As shown in FIG. 6, tape peeling member 136 and tape folding member 137 are provided on the upper face of first tape holding portion 133. Tape peeling member 136 is disposed on the upstream side of the opening hole in the conveyance direction. Tape peeling member 136 is a peeling blade for peeling cover tape 220 from base tape 210 of carrier tape 200. Tape folding member 137 is a member for lifting and folding back one side in the width direction of cover tape 220 peeled off from base tape 210 (specifically, the side of carrier tape 200 on which accommodation holes 211 for accommodating components are disposed).

First tape holding portion 133 is provided with rotation fulcrum 133a. Rotation fulcrum 133a is disposed at the front end so that the rear end of first tape holding portion 133 can move upward. Lever 138, operable by an operator, protrudes from the rear end of first tape holding portion 133. A biasing member (not shown) for biasing the rear end of first tape holding portion 133 downward is assembled between the rear end of first tape holding portion 133 and feeder main body 110. First tape holding portion 133 retains carrier tape 200 between first tape holding portion 133 and sprocket 131 when lever 138 is not lifted, whereas retaining of carrier tape 200 between first tape holding portion 133 and sprocket 131 is released when lever 138 is lifted against the biasing force of the biasing member.

Tape feeder 100 also has cover tape feeding mechanism 140. Cover tape feeding mechanism 140 is disposed in the central lower portion of feeder main body 110. Cover tape feeding mechanism 140 is a mechanism for feeding cover tape 220, peeled off by tape peeling member 136 and folded back by tape folding member 137, in a direction opposite to conveyance direction X of carrier tape 200. Cover tape feeding mechanism 140 includes gear 141, motor 142, and second tape holding portion 143.

Gear 141 is rotatably mounted at a central lower portion of feeder main body 110. Motor 142 is coupled to gear 141. Motor 142 is a servomotor for driving gear 141 in a rotational manner. Second tape holding portion 143 is a site at which cover tape 220 to be fed out is held so that cover tape 220 does not detach from feeder main body 110. Second tape holding portion 143, as shown in FIG. 7, has gear 144, arm 145, lever 146, and coil spring 147.

Gear 144 is engaged with gear 141 described above. Arm 145 is provided with rotation fulcrum 145a. Arm 145 is formed so as to move gear 144 toward gear 141 about rotation fulcrum 145a. Lever 146 protrudes downward from arm 145. Coil spring 147 generates a biasing force which urges arm 145 toward the gear 141 side via lever 146. Second tape holding section 143 holds cover tape 220 by engaging gear 144 with gear 141 by the biasing force of coil spring 147 when lever 146 is not moved, whereas when lever 146 is moved against the biasing force of coil spring 147, gear 144 separates from gear 141, and the holding of cover tape 220 is released.

Tape feeder 100 also has cover tape feed guide 150. Cover tape feed guide 150 is provided between tape peeling member 136 of tape feeder 100 and cover tape feeding mechanism 140. Cover tape feed guide 150 guides cover tape 220 peeled off by tape peeling member 136 to cover tape feeding mechanism 140. Cover tape feed guide 150 is constituted by a pair of guide rollers 151,152. Guide rollers 151,152 are disposed above carrier tape 200 which is guided on tape feed guide 111. Guide roller 151 disposed on the front end side of tape feeder 100 is functioning as applying tension to cover tape 220 to prevent loosening of cover tape 220.

In tape feeder 100, after being conveyed in conveyance direction X, carrier tape 200 is first pulled out from tape reel 240, guided by tape feed guide 111, and held in first tape holding portion 133. Then, carrier tape 200 is conveyed in conveyance direction X by rotation of motor 132 while being held by first tape holding portion 133. While carrier tape 200 is conveyed, tape peeling member 136 enters between base tape 210 and cover tape 220, causing tape 220 to peel off from base tape 210. Cover tape 220 peeled off from base tape 210 is routed from first tape holding portion 133 to second tape holding portion 143 through a path (hereinafter, referred to as a discharge path) that passes through the pair of guide rollers 151,152. Then, cover tape 220, while being held by second tape holding portion 143, is discharged to the outside of feeder main body 110 (specifically, below second tape holding portion 143) by rotation of motor 142, which is synchronized with the rotation of motor 132.

Figure 8:
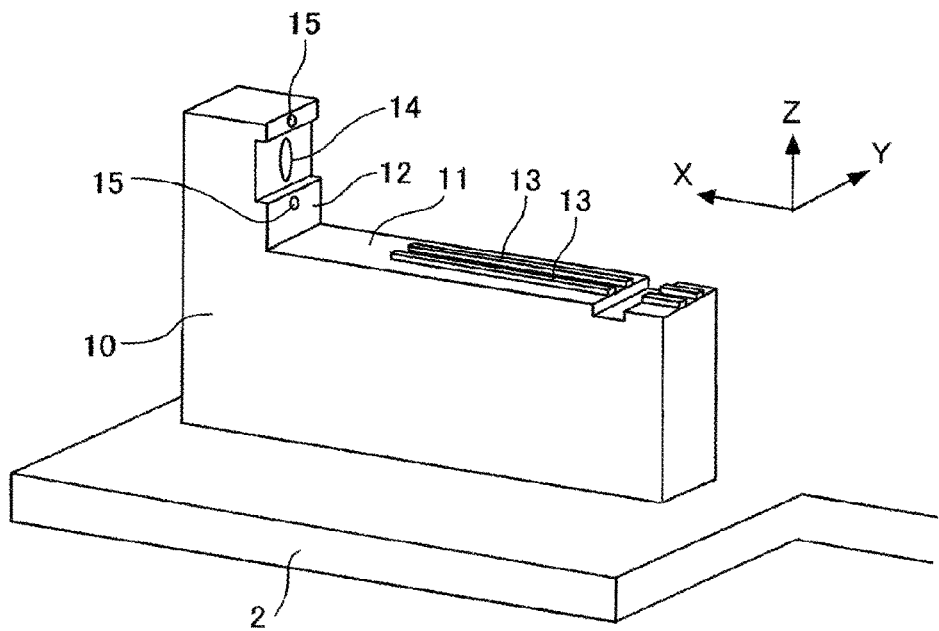
FIG. 8 A schematic perspective view of a feeder holding stand provided with the tape autoloading device.

Next, the configuration of tape autoloading device 1 will be described with reference to FIGS. 8 to 17. In tape autoloading device 1, feeder holding stand 10 is a stand for holding tape feeder 100 described above. Feeder holding stand 10, as shown in FIG. 8, is disposed in the central portion of base 2 of tape autoloading device 1. Feeder holding stand 10 has placement portion 11 and abutting portion 12. The bottom face of feeder main body 110 of tape feeder 100 is placed on placement portion 11. The front face of feeder main body 110 comes in contact with abutting portion 12. A pair of support guides 13 for sandwiching the lower portions of both side faces of feeder main body 110 are provided on placement portion 11. Abutting portion 12 is provided with a communication jack 14, capable of communicating with and supplying power to tape feeder 100, and positioning portion 15, for positioning tape feeder 100.

Figure 9:
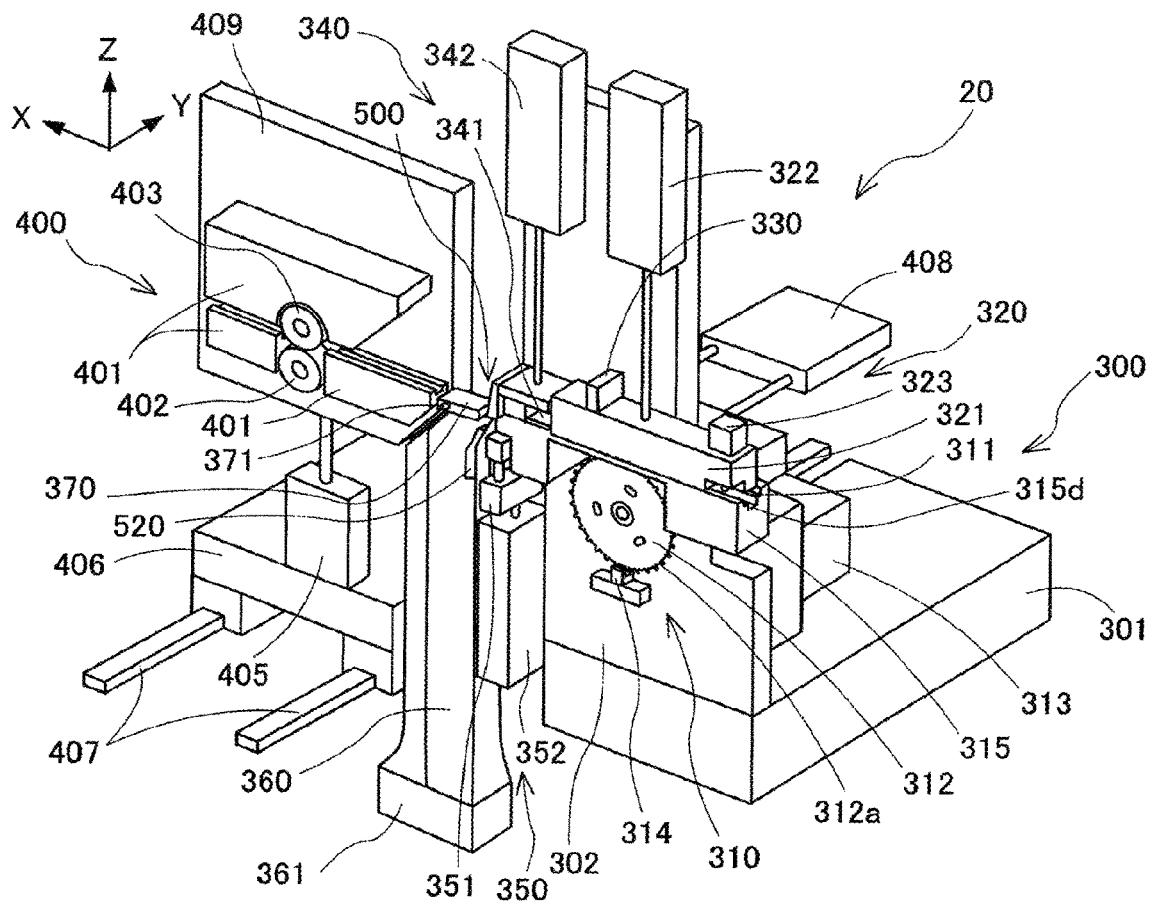
FIG. 9 A schematic perspective view of an automatic tape processing device provided in the tape autoloading device.
Figure 12:
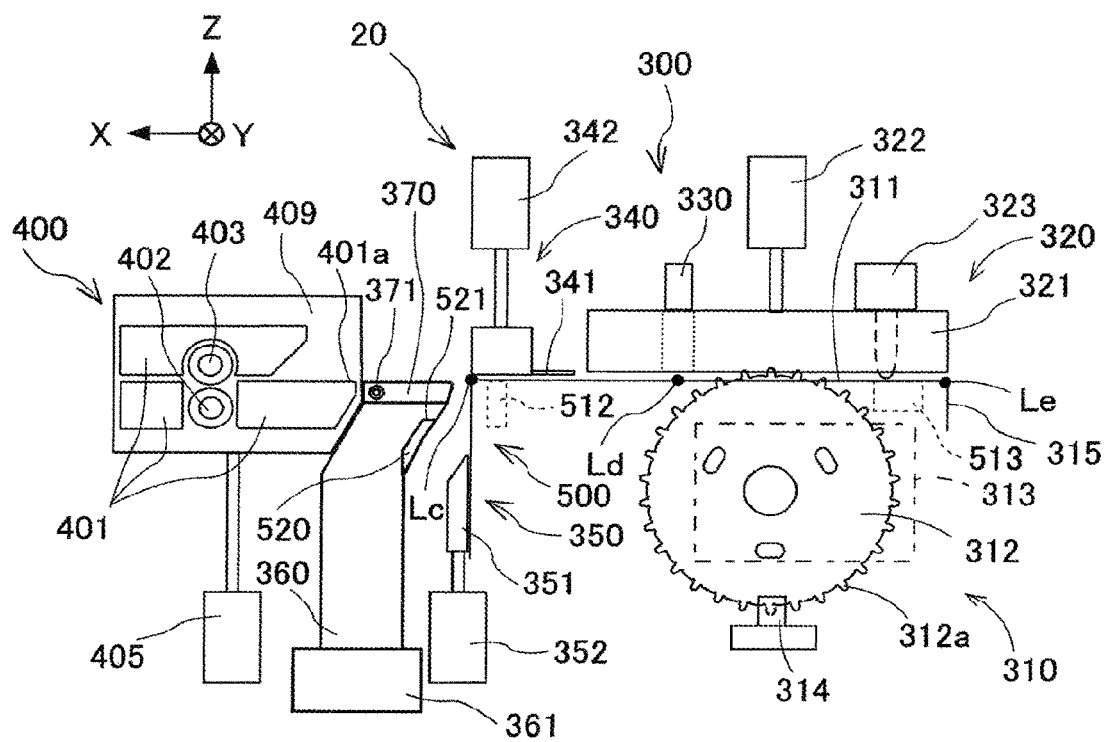
FIG. 12 A diagram showing the operation of the automatic tape processing device provided in the tape autoloading device.

Automatic tape processing device 20 is a device for processing the leading end of carrier tape 200 and transferring carrier tape 200 to the next step. Automatic tape processing device 20, as shown in FIGS. 9 and 12, has tape leading-end processing device 300, transfer device 400, and lift-up device 500.

Tape leading-end processing device 300 is a device for forming the leading end of carrier tape 200 into a predetermined shape. Tape leading-end processing device 300 includes feeding device 310, guide device 320, detection device 330, peeling device 340, cutting device 350, and duct 360. Feeding device 310, guide device 320, peeling device 340, cutting device 350, and duct 360 are attached to support plate 302 erected vertically on horizontal pedestal 301. Pedestal 301 is provided on and fixed to base 2.

Feeding device 310 is a device for conveying carrier tape 200 along conveyance path 311 (pitch feed), and sequentially positioning cutting portion Q1 of base tape 210 and cutting portion Q2 of cover tape 220 at cutting position Lc. Feeding device 310 includes sprocket 312, gear motor 313, and sprocket tooth detection device 314.

Figure 10:
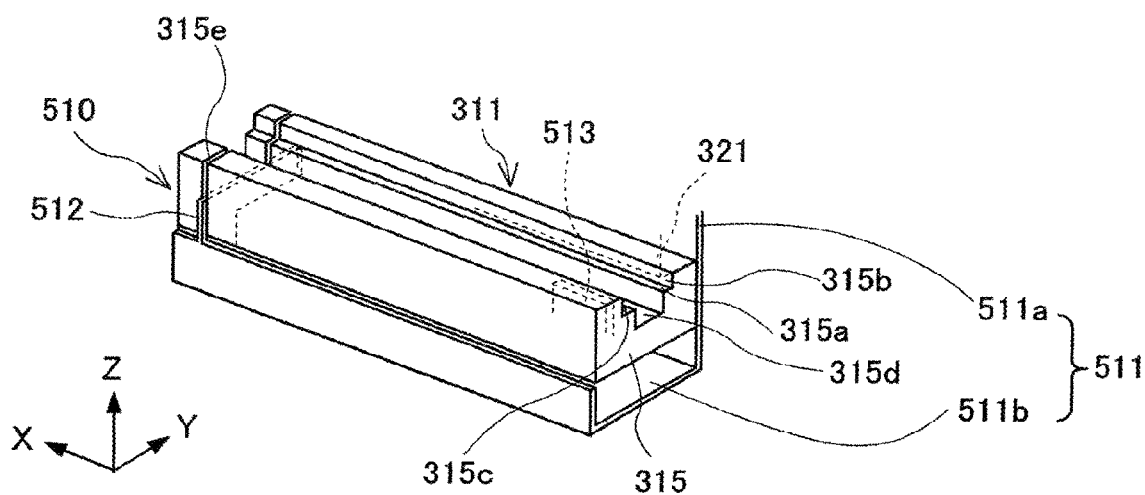
FIG. 10 A schematic perspective view of a conveyance member and surroundings when a guide device of a tape leading-end processing device of the automatic tape processing device is in a lifted position.
Figure 11:
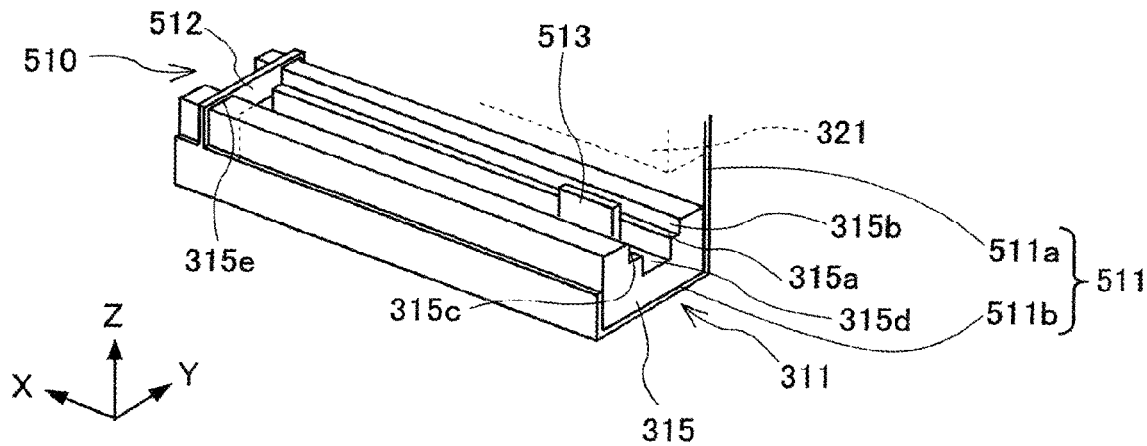
FIG. 11 A schematic perspective view of the conveyance member and surroundings when the guide device of the tape leading-end processing device of the automatic tape processing device is in a lowered position.

Conveyance path 311 is provided in conveyance member 315. Conveyance path 311 extends linearly from tape inlet Le in conveyance member 315 to cutting position Lc in a direction parallel to conveyance direction X of tape feeder 100 held by feeder holding stand 10. Hereinafter, the direction in which conveyance path 311 extends is also referred to as conveyance direction X. Conveyance path 311 has a groove shape. That is, as shown in FIGS. 10 and 11, conveyance member 315 has conveyance floor 315a and two conveyance side walls 315b, 315c that form conveyance path 311.

Conveyance floor 315a is a bottom surface to which the bottom surface of carrier tape 200 can come into contact and has a width slightly larger than the width of carrier tape 200. Conveyance side walls 315b, 315c are provided upright at both ends of conveyance floor 315a in the width direction. Conveyance side walls 315b, 315c have a height extending from conveyance floor 315a to the thickness of carrier tape 200 or more. Conveyance side walls 315b, 315c may come in contact with the side surfaces of carrier tape 200.

Conveyance member 315 has cavity groove 315d. Cavity groove 315d is in the center, in the width direction, of conveyance floor 315a. When carrier tape 200 is an embossed tape, cavity groove 315d is a groove for allowing the portion of carrier tape 200 that constitutes the accommodation holes 211 in which components are accommodated to pass in a direction parallel to conveyance direction X.

Sprocket 312 is disposed below conveyance member 315 in which conveyance path 311 is provided. Teeth 312a are formed on the outer peripheral surface of sprocket 312. Multiple teeth 312a are provided in the circumferential direction at the same pitch as the pitch of engagement holes 212 of carrier tape 200. Sprocket 312 is configured to mesh with engagement holes 212 of carrier tape 200 conveyed along conveyance path 311 in a state in which tooth 312a that reaches the uppermost portion by rotation protrudes upward through the through-hole provided at the edge side in the width direction of conveyance floor 315a.

Gear motor 313 is connected to sprocket 312. Gear motor 313 is, for example, a stepping motor capable of rotating sprocket 312. By driving gear motor 313 in a rotational manner, it is possible to position each of cutting point Q1 of base tape 210 of carrier tape 200 which is engaged with sprocket 312 and cutting point Q2 of cover tape 220 at cutting position Lc.

Sprocket tooth detection device 314 is located in the vicinity of sprocket 312. Sprocket tooth detection device 314 is, for example, a photosensor, and detects when one of teeth 312a provided on the outer peripheral surface of sprocket 312 reaches the home position in which tooth 312a is oriented vertically upward. This detection may be achieved by reading a mark attached to the side face of sprocket 312.

Guide device 320 is a device for guiding carrier tape 200 conveyed along conveyance path 311 of feeding device 310, specifically, a pressing device for pressing the upper surface of carrier tape 200. Guide device 320 is located above feeding device 310. Guide device 320 includes abutting member 321, air cylinder 322, and tape detection sensor 323.

Abutting member 321 is a portion that abuts the upper surface of carrier tape 200 conveyed along conveyance path 311 of feeding device 310. Abutting member 321 is lifted or lowered away from or closer to conveyance floor 315a of conveyance member 315. Air cylinder 322 is capable of lifting and lowering abutting member 321 away from or closer to conveyance floor 315a of conveyance member 315. Tape detection sensor 323 is disposed near tape inlet Le of conveyance member 315. Tape detection sensor 323 is, for example, a touch sensor or a photo sensor, and is a sensor for detecting when carrier tape 200 has been inserted into tape inlet Le. When abutting member 321 and conveyance member 315 are in contact, guide device 320 guides carrier tape 200, along an upper reference surface, when carrier tape 200 is conveyed along conveyance path 311, whereas when abutting member 321 and conveyance member 315 are apart, carrier tape 200 can separate from conveyance path 311.

Detection device 330 is a device for detecting carrier tape 200 conveyed along conveyance path 311. Detection device 330 is disposed above predetermined detection position Ld provided on conveyance path 311. Detection position Ld is located downstream in the conveyance direction from the engagement position where teeth 312a of sprocket 312 engage with engagement holes 212 of carrier tape 200. Detection device 330 is, for example, a photo sensor or a camera, and is attached to abutting member 321. Detection device 330 detects accommodation holes 211 of carrier tape 200 conveyed along conveyance path 311, the tape portions between accommodation holes 211, and components accommodated in accommodation holes 211. Component detection by detection device 330 is performed, for example, by utilizing a change in the amount of light.

Peeling device 340 is a device for peeling cover tape 220 from base tape 210 of carrier tape 200 conveyed along conveyance path 311. Peeling device 340 is disposed above feeding device 310 in the conveyance direction downstream from the engagement position described above. Peeling device 340 includes scraper 341 and air cylinder 342. Scraper 341 has a sharp blade. The blade of scraper 341 can enter between base tape 210 and cover tape 220. Scraper 341 peels, with its blade, cover tape 220 from base tape 210 of carrier tape 200 conveyed along conveyance path 311. Scraper 341 can be positioned at an entry height position, at which the blade enters between base tape 210 and cover tape 220, or a retraction height above the entry height. Air cylinder 342 is capable of lifting and lowering scraper 341 between the entry height and the retraction height.

Cutting device 350 is a device for cutting each of cutting point Q2 of cover tape 220 and cutting point Q1 of base tape 210 at cutting position Lc on conveyance path 311. Cutting device 350 is disposed below feeding device 310 downstream in the conveyance direction from peeling device 340. Cutting device 350 includes cutter 351 and air cylinder 352. Cutter 351 is a single blade cutter having a width greater than the width of carrier tape 200. Cutter 351 can enter cutting position Lc on conveyance path 311 by being lifted from below. Cutter 351 cuts cutting points Q1,Q2 of base tape 210 and cover tape 220 positioned at cutting position Lc. Air cylinder 352 can lift and lower cutter 351 between cutting position Lc and a retraction height which is lower than cutting position Lc.

Duct 360 is a pipe for discharging the cut components of base tape 210 and cover tape 220, cut at cutting position Lc, to waste box 361. Duct 360 is disposed downstream in conveyance direction X from cutting device 350. Cut components of base tape 210 and cover tape 220, cut at cutting position Lc, are contained in waste box 361 through duct 360.

Guide 370 is provided near the upper end opening of duct 360. Guide 370 guides carrier tape 200 which is conveyed from the conveyance member 315 side toward the transfer device 400 side. Guide 370 has a plate shape. Guide 370 extends in the same direction as conveyance path 311 of feeding device 310, between conveyance member 315 and transfer device 400. Guide 370 also functions as a switching mechanism for opening and closing the upper end opening of duct 360.

Guide 370 is pivotally attached to support plate 302 via support pin 371. Support pin 371 extends in the orthogonal direction Y and is supported on support plate 302 in a rotatable manner. Support pin 371 is disposed downstream in conveyance direction X from guide 370. Guide 370 can pivot about support pin 371. Guide 370 can pivot between a position at which conveyance of carrier tape 200 in conveyance direction X is permitted (hereinafter, referred to as the conveyance permitting position) and a position at which conveyance is prohibited (hereinafter, referred to as the conveyance prohibiting position). Guide 370 is pivoted in conjunction with the elevation of support plate 409 of transfer device 400, which will be described later.

Transfer device 400 is a device for conveying carrier tape 200, cut by cutting device 350, in a direction different from the longitudinal direction of carrier tape 200 and then transferring carrier tape 200 to tape conveyance device 30. Transfer device 400 is disposed downstream in the conveyance direction from tape leading-edge processing device 300. Transfer device 400 includes guide 401, driving roller 402, driven roller 403, gear motor 404, lifting/lowering air cylinder 405 pedestal 406, rail 407, and horizontal-moving air cylinder 408. Guide 401, driving roller 402, driven roller 403, and gear motor 404 are attached to support plate 409.

Guide 401 guides carrier tape 200 cut by cutting device 350. Guide 401 extends in the same direction as conveyance path 311 of feeding device 310. Guide 401 is provided on both the lower and upper faces of carrier tape 200 that is to be guided. Guide 401 on the lower face of carrier tape 200 sandwiches driving roller 402 and is disposed upstream and downstream in the conveyance direction from driving roller 402. Further, guide 401 on the upper face of carrier tape 200 is arranged so as to face, in the up-down direction, guide 401 of the lower face. Driving roller 402 is disposed in the middle of guide 401 in the conveyance direction. Driven roller 403 is disposed to face the upper side of driving roller 402. Driven roller 403 is biased toward the driving roller 402 side by a biasing member (not shown). Driving roller 402 and driven roller 403 can grip carrier tape 200 that is guided to guide 401. Gear motor 404 is a motor for rotationally driving the driving roller 402.

Lifting/lowering air cylinder 405 is placed and fixed on pedestal 406. Lifting/lowering air cylinder 405 is capable of lifting and lowering support plate 409 described above. Support plate 409 is lifted and lowered by lifting/lowering air cylinder 405 so that tape convey-in port 401a of guide 401 is positioned at one of cutting position Lc in conveyance path 311 and a retraction position above.

Pedestal 406 is slidable in a horizontal direction. The horizontal direction in which pedestal 406 moves is a direction orthogonal to conveyance direction X in which conveyance path 311 extends. Hereinafter, this horizontal direction is referred to as orthogonal direction Y. A pair of rails 407 are separated from each other by a predetermined distance in conveyance direction X and provided on base 2. Each rail 407 extends in orthogonal direction Y. The pair of rails 407 holds pedestal 406 in a slidable manner. Horizontal-moving air cylinder 408 is disposed between the pair of rails 407 on base 2. Horizontal-moving air cylinder 408 can slide pedestal 406 in orthogonal direction Y on the pair of rails 407. Pedestal 406 is slid in orthogonal direction Y by horizontal-moving air cylinder 408 so that carrier tape 200 cut by cutting device 350 is positioned at either one of the cutting position Lc side of conveyance path 311 or the tape convey-in position side of tape conveyance device 30.

Lift-up device 500 is a device for lifting up above-described carrier tape 200 extending along conveyance path 311 and cut by cutting device 350 before being moved in orthogonal direction Y by horizontal-moving air cylinder 408. This lift-up is performed so that the lowermost portion of carrier tape 200, when carrier tape 200 is deflected by the lift-up, is lifted above the upper edge of conveyance side wall 315c, which is positioned on the feeder holding stand 10 side in orthogonal direction Y of the two conveyance side walls 315b, 315c of conveyance member 315, while the leading end of carrier tape 200 is held between driving roller 402 and driven roller 403 (i.e., a state in which a predetermined tension is applied to carrier tape 200). Lift-up device 500 includes lifting mechanism 510 and air supply device 520.

Lifting mechanism 510 is a mechanism for performing the lift-up described above in direct contact with carrier tape 200 that extends along conveyance path 311 and is cut by cutting device 350. Lifting mechanism 510 is movable up and down in up-down direction Z. Lifting mechanism 510, as shown in FIGS. 10 and 11, is coupled to abutting member 321 of guide device 320. Abutting member 321 is close to conveyance member 315 while carrier tape 200 is conveyed in conveyance direction X along conveyance path 311, and can be lifted and lowered so as to be separated from conveyance member 315 at the time of moving in orthogonal direction Y of carrier tape 200. Lifting mechanism 510 is lifted and lowered together with abutting member 321, that is, in conjunction with the lifting and lowering of abutting member 321. Lifting mechanism 510 includes L-shaped portion 511, first lifting portion 512, and second lifting portion 513.

L-shaped portion 511 includes upright portion 511a erected in up-down direction Z and horizontal portion 511b extending horizontally. Upright portion 511a is attached and fixed to abutting member 321. Specifically, upright portion 511a is attached to the side surface or the upper surface of abutting member 321 on the side opposite feeder holding stand 10 side in orthogonal direction Y. The lower end of upright portion 511a is located lower than the lower end of abutting member 321.

Horizontal portion 511b is provided integrally with upright portion 511a and extends horizontally from the lower end of upright portion 511a toward the feeder holding stand 10 side in orthogonal direction Y. Horizontal portion 511b is disposed below conveyance member 315. Horizontal portion 511b can be lifted and lowered below conveyance member 315 by the same amount as the up-down lifting/lowering amount of abutting member 321. Horizontal portion 511b is spaced downward from the lower face of conveyance member 315 when abutting member 321 and conveyance member 315 are in contact, whereas horizontal portion 511b comes in contact with the lower face of conveyance member 315 when abutting member 321 and conveyance member 315 are separated.

Each of first lifting portion 512 and second lifting portion 513 is a portion that directly comes in contact with carrier tape 200 and lifts carrier tape 200. First lifting portion 512 and second lifting portion 513 are provided apart from each other in conveyance direction X of conveyance member 315. Carrier tape 200 that extends along conveyance path 311 is lifted by the upper end surfaces of first lifting portion 512 and second lifting portion 513.

First lifting portion 512 is disposed downstream in conveyance direction X from conveyance member 315. First lifting portion 512 is provided so as to protrude from upright portion 511a or horizontal portion 511b. First lifting portion 512 has a plate shape extending in orthogonal direction Y and erected in up-down direction Z. Conveyance member 315 is provided with through-hole (i.e., slit) 315e, penetrating up-down direction Z, into which first lifting portion 512 can be inserted. First lifting portion 512 can be inserted into through-hole 315e of conveyance member 315. First lifting portion 512 is located at a height that does not protrude upward from through-hole 315e when horizontal portion 511b is spaced downward from the lower face of conveyance member 315, whereas first lifting portion 512 is located at a height at which first lifting portion 512 protrudes upward from through-hole 315e and appears above conveyance path 311 when horizontal portion 511b contacts the lower face of conveyance member 315.

Second lifting portion 513 is disposed partway through conveyance direction X of conveyance member 315. Second lifting portion 513 is provided so as to protrude upward from horizontal portion 511b. Second lifting portion 513 has a plate shape extending in conveyance direction X and erected in up-down direction Z. The bottom face of cavity groove 315d of conveying member 315 has a through-hole (i.e., slit;

not shown), penetrating in up-down direction Z, into which second lifting portion 513 can be inserted. It is preferable that the through-hole is upstream in conveyance direction X from the through-hole through which teeth 312a of sprocket 312 protrudes upward in order to allow engagement holes 212 of carrier tape 200 to disengage from teeth 312a of sprocket 312. Second lifting portion 513 can be inserted into the through-hole at the bottom face of cavity groove 315d of conveyance member 315. Second lifting portion 513 is located at a height that does not protrude from the through-hole when horizontal portion 511b is separated from the lower face of conveyance member 315, whereas second lifting portion 513 is located at a height at which second lifting portion 513 protrudes from the through-hole and appears above conveyance path 311 when horizontal portion 511b contacts the lower face of conveyance member 315.

Air supply device 520 is a device for lifting carrier tape 200, which extends along conveyance path 311 and is cut by cutting device 350, by way of a pressure difference between the upper and lower spaces sandwiching carrier tape 200. Air supply device 520 supplies positive pressure air to the region in which conveyance path 311 of conveyance member 315 is provided to guide the positive pressure air to the space under carrier tape 200 along conveyance path 311. Air supply device 520 is disposed downstream in conveyance direction X from conveyance member 315 and below conveyance path 311.

Air supply device 520 has air injection port 521. Air injection port 521 is located within duct 360. Air injection port 521 is provided from inside duct 360 through the upper end opening of duct 360 and directed toward the downstream side, in the conveyance direction, of conveyance member 315. Air injection port 521 injects positive pressure air toward the downstream side, in the conveyance direction, of conveyance member 315. Positive pressure air injected from air injection port 521 is guided to a space (hereinafter referred to as lower space 316; refer to FIG. 29) formed below carrier tape 200 which is conveyed along conveyance path 311 on the upper portion of conveyance member 315. Injection of positive pressure air from air injection port 521 is performed at a predetermined timing to be described later.

First lifting portion 512 of lifting mechanism 510 of lift-up device 500 described above may be disposed so that the positive pressure air from air injection port 521 is easily guided to lower space 316 of carrier tape 200. For example, if air injection port 521 is disposed further downstream in the conveyance direction than first lifting portion 512, which is downstream from lower space 316, a notch or through-hole penetrating in conveyance direction X may be provided in plate-shaped first lifting portion 512, for the purpose of guiding the positive pressure air from air injection port 521 to lower space 316 of carrier tape 200.

Tape conveyance device 30 is a device for conveying carrier tape 200 in conveyance direction X. Tape conveyance device 30 is disposed on base 2 at an oblique direction with respect to automatic tape processing device 20 with tape feeder 100, held by feeder holding stand 10, interposed in between. Tape conveyance device 30 is capable of advancing and retracting in orthogonal direction Y on base 2 and can be moved away from or brought closer to tape feeder 100 held by feeder holding stand 10.

Figure 13:
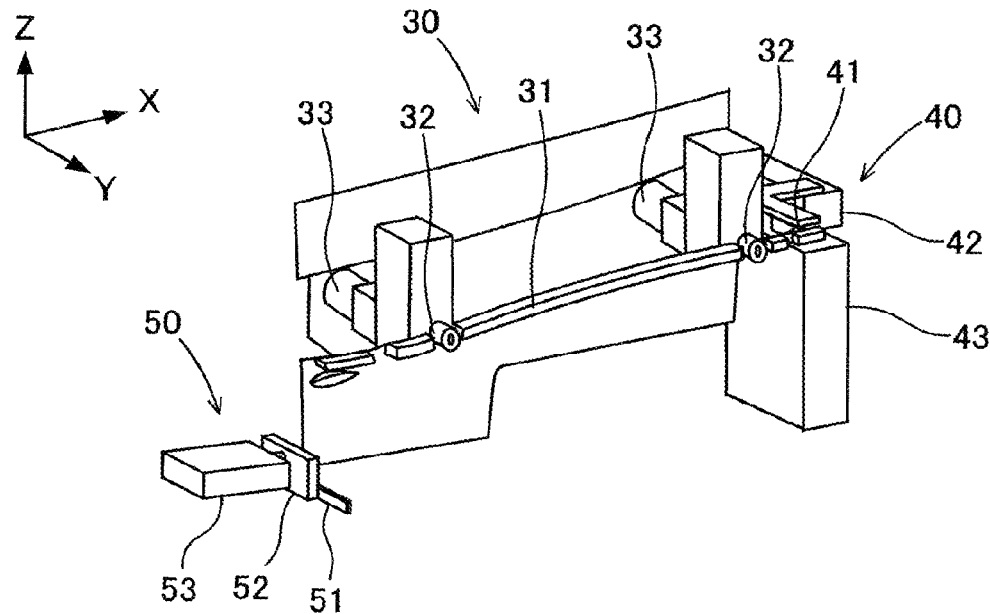
FIG. 13 A schematic perspective view of a tape conveyance device, a first release device, and a second release device provided in the tape autoloading device.

Tape conveyance device 30, as shown in FIG. 13, has guides 31, two driving rollers 32, and two gear motors 33. Guide 31 guide carrier tape 200 conveyed in conveyance direction X. Two driving rollers 32 are spaced apart from each other in conveyance direction X. Each of two gear motors 33 rotationally drives a corresponding driving roller 32. Portions of guide 31 are respectively disposed to the rear of the rear driving roller 32, between the two driving rollers 32, and to the front of the front driving roller 32.

Tape conveyance device 30 is placed and fixed on pedestal 34. Pedestal 34 is slidable in orthogonal direction Y. Pedestal 34 is slidably held on a pair of rails 35. The pair of rails 35 are arranged with a predetermined spacing in conveyance direction X on base 2. Each rail 35 extends in orthogonal direction Y. Pedestal 34 is connected to air cylinder 36 fixed to base 2. Air cylinder 36 can cause pedestal 34 to slide along the pair of rails 35 on base 2 in orthogonal direction Y with air from an external air supply source (not shown). Pedestal 34 is slid in orthogonal direction Y integrally with tape conveyance device 30 on base 2 by air cylinder 36.

As described above, when tape feeder 100 is held by feeder holding stand 10, and pedestal 406 of transfer device 400 of automatic tape processing device 20 and pedestal 34 of tape conveyance device 30 are each brought close to tape feeder 100 by sliding, carrier tape 200 is guided through the gap between the upper and lower pair of guides 401 of transfer device 400 and guided through the gap between guide 31 of tape conveyance device 30 and tape feed guide 111 of tape feeder 100.

First release device 40 is a device for releasing the holding of carrier tape 200 by first tape holding portion 133 of tape feeder 100. Further, second release device 50 is a device for releasing the holding of cover tape 220 by second tape holding portion 143 of tape feeder 100. First release device 40 and second release device 50 are, on base 2, disposed on the tape conveyance device 30 side, in orthogonal direction Y, with respect to the layout position of tape feeder 100 held by feeder holding stand 10.

First release device 40 includes first lift lever 41, support table 42, and air cylinder 43. First lift lever 41 contacts lever 138 of first tape holding portion 133 and causes lever 138 to move in up-down direction Z (i.e., the direction orthogonal to both transport direction X and orthogonal direction Y). Support table 42 supports first lift lever 41 with the distal end of first lift lever 41 protruding to the tape feeder 100 side. Air cylinder 43 is fixed on pedestal 34 of tape conveyance device 30. Air cylinder 43 can lift and lower support table 42 in up-down direction Z with air from an air supply source.

Second release device 50 includes second lift lever 51, support table 52, and air cylinder 53. Second lift lever 51 contacts lever 146 of second tape holding portion 143 and causes lever 146 to move in conveyance direction X. Support table 52 supports second lift lever 51 with the distal end of second lift lever 51 protruding to the tape feeder 100 side. Air cylinder 53 is fixed on pedestal 54. Air cylinder 53 can move support table 52 in conveyance direction X.

Pedestal 54 is slidably held in orthogonal direction Y on a pair of rails 55. The pair of rails 55 are arranged with a predetermined spacing in conveyance direction X on base 2. Each rail 55 extends in orthogonal direction Y. Pedestal 54 is connected to air cylinder 56 fixed to base 2. Air cylinder 56 can cause pedestal 54 to slide along the pair of rails 55 on base 2 in orthogonal direction Y with air from an external air supply source. Pedestal 54 is slid in orthogonal direction Y integrally with support table 52 on base 2 by air cylinder 56.

Figure 14:
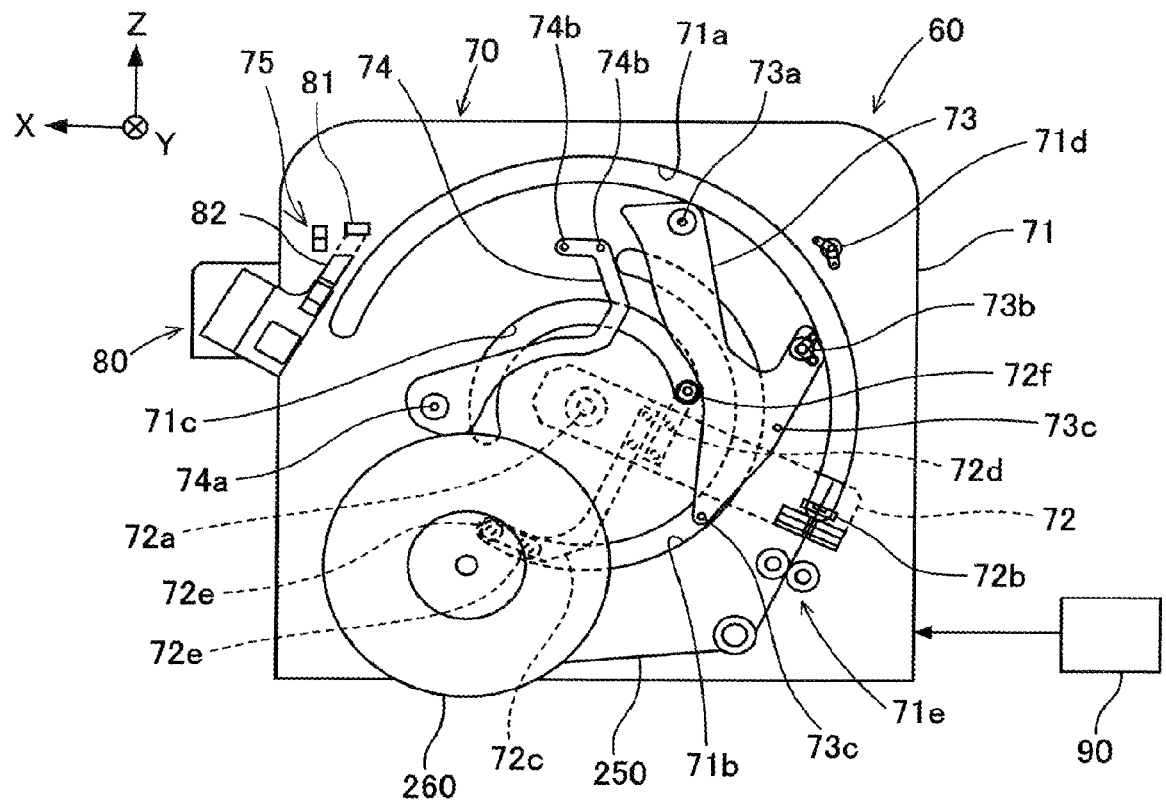
FIG. 14 A schematic side plane view of a cover tape processing device provided in the tape autoloading device.

Cover tape processing device 60 is a device for discharging peeled cover tape 220 to the outside of feeder main body 110 along a predetermined path by transferring a temporary tape to be described later to tape feeder 100 held by feeder holding stand 10 and from which cover tape 220 is peeled off from base tape 210 of carrier tape 200. Cover tape processing device 60 is disposed on base 2 on the side where cover tape feeding mechanism 140 of tape feeder 100 held by feeder holding stand 10 is exposed, that is, on the automatic tape processing device 20 side in orthogonal direction Y with respect to the layout position of tape feeder 100. Cover tape processing device 60, as shown in FIG. 14, has temporary tape routing device 70, cover tape gripping device 75, connecting device 80, and transfer device 90.

Figure 15:
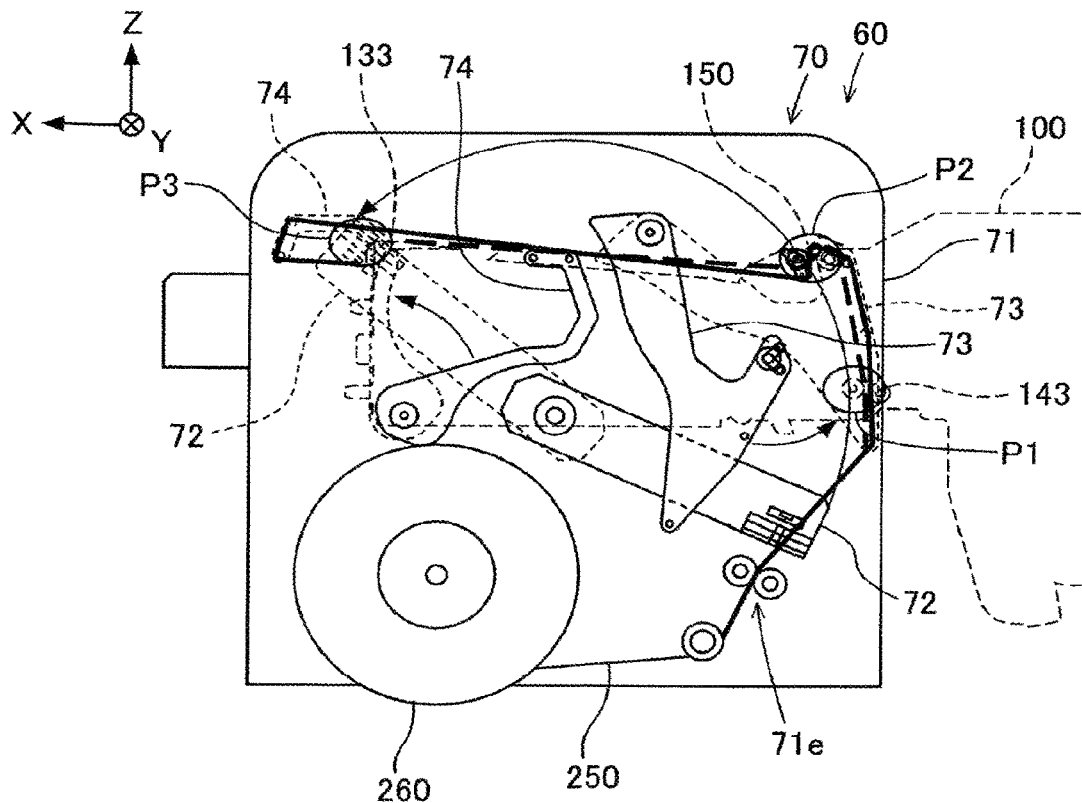
FIG. 15 A side plane view showing the relative positions of the cover tape processing device and the tape feeder.

Temporary tape routing device 70 is a device for routing and holding temporary tape 250 along a path that follows the discharge path of cover tape 220. In FIG. 15, the discharge path is indicated by a thick broken line, and the path that follows the discharge path is indicated by a thick solid line. Temporary tape 250 is a tape, different from carrier tape 200 wound on tape reel 240, in which a lead-out portion along the discharge path of cover tape 220 is formed in advance. Temporary tape 250 has the same shape and is made of the same material as cover tape 220 of carrier tape 200. Temporary tape 250 is wound around temporary tape reel 260 which can be installed in temporary tape routing device 70. Temporary tape 250 is coupled to cover tape 220 peeled from base tape 210 of carrier tape 200 and then transferred to tape feeder 100.

Temporary tape routing device 70 is placed and fixed on pedestal 61 shown in FIG. 1. Pedestal 61 is installed, to be slidable in orthogonal direction Y, on a pair of rails 62. The pair of rails 62 are arranged on base 2 with a predetermined spacing in conveyance direction X. Each rail 62 extends in orthogonal direction Y. Pedestal 61 is connected to air cylinder 63 fixed to base 2. Air cylinder 63 can cause pedestal 61 to slide along the pair of rails 62 on base 2 in orthogonal direction Y with air from an external air supply source. Pedestal 61 is slid in orthogonal direction Y integrally with temporary tape routing device 70 on base 2 by air cylinder 63.

Temporary tape routing device 70 has main body plate 71, transfer portion 72, first pushing portion 73, and second pushing portion 74. Main body plate 71 is a flat plate member having a substantially rectangular shape. Main body plate 71 has three guide holes 71a, 71b, 71c formed concentrically, each slit having a circular arc shape. Outer support pin mechanism 71d and a pair of temporary tape support rollers 71e are installed on main body plate 71. Outer support pin mechanism 71d supports by coming in contact with temporary tape 250 from the outer side. Outer support pin mechanism 71d has support plate 71f. Support plate 71f can rotate with respect to main body plate 71 via rotation fulcrum 71g. At a distal end of support plate 71f, pin 71h for supporting temporary tape 250 is attached so as to protrude in orthogonal direction Y. Temporary tape support rollers 71e guide and support temporary tape 250 pulled out from temporary tape reel 260.

Transfer portion 72 is disposed on the rear side of main body plate 71 (i.e., the side opposite to the feeder holding stand 10 side). Transfer portion 72 is rotatably supported at the arc center of guide hole 71a by rotating fulcrum 72a. Gripping claw 72b is provided at the distal end of transfer portion 72. Gripping claw 72b is supported by the edge of guide hole 71a having the largest diameter among three guide holes 71a, 71b, 71c in main body plate 71. Gripping claw 72b can grip temporary tape 250 at the front of main body plate 71, that is, on the feeder holding stand 10 side.

Arms 72c, 72d are fixed on transfer portion 72. Arms 72c, 72d each extend, in the circumferential direction from transfer portion 72, between rotating fulcrum 72a and gripping claw 72b. Arm 72c is located on the lower side with respect to transfer portion 72. The two contact rollers 72e are rotatably supported at the distal end of arm 72c. Each contact roller 72e is supported by the edge of guide hole 71b having an intermediate diameter among three guide holes 71a, 71b, 71c in main body plate 71. Each contact roller 72e protrudes to the front side of main body plate 71. Arm 72d is positioned on the upper side with respect to transfer portion 72. Contact roller 72f is rotatably supported at the distal end of arm 72d. Contact roller 72f is supported by the edge of guide hole 71c having the smallest diameter among three guide holes 71a, 71b, 71c in main body plate 71. Contact roller 72f protrudes to the front side of main body plate 71.

In temporary tape routing device 70, when transfer portion 72 is rotated by a driving motor (not shown), the leading end of temporary tape 250 gripped by gripping claw 72b is transferred along guide hole 71a. In the process in which transfer portion 72 rotates from an initial angle to a predetermined transfer complete angle, as shown in FIG. 15, the leading end of temporary tape 250 is transferred to third position P3, corresponding to first tape holding portion 133 of tape feeder 100, by passing through first position P1, corresponding to second tape holding portion 143 of tape feeder 100, and second position P2, corresponding to cover tape feed guide 150 of tape feeder 100.

First pushing portion 73 is disposed at the front side of main body plate 71. First pushing portion 73 is rotatably supported by rotating fulcrum 73a. First pushing portion 73 is biased by a biasing member in the circumferential direction about rotation fulcrum 73a (i.e., the clockwise direction shown in FIG. 14), and in the initial state, first pushing portion 73 is kept in contact with contact roller 72f of transfer portion 72. Inner support pin mechanism 73b and two guide pins 73c are both installed on the front side of first pushing portion 73. Inner support pin mechanism 73b supports temporary tape 250 by coming in contact with temporary tape 250 from the inner side. Inner support pin mechanism 73b has two support plates 73d, 73e. Support plates 73d, 73e, respectively, are rotatable relative to first pushing portion 73 about rotation fulcrum 73a. Pins 73f, 73g for supporting temporary tape 250 are installed on the distal ends of support plates 73d, 73e, respectively, so as to protrude in orthogonal direction Y. Each of pins 73f, 73g is rotatable about rotating fulcrum 73a.

Pins 73f, 73g are each connected to tension spring 73h. The initial spacing between pin 73f and pin 73g is maintained at a predetermined spacing by the elastic force of tension spring 73h. The spacing is the distance between pins 73f, 73g when the relative angular deviation of support plates 73d, 73e about rotation fulcrum 73a is, for example, about 90°.

Second pushing portion 74 is disposed on the front side of main body plate 71. Second pushing portion 74 is rotatably supported by rotation fulcrum 74a. Second pushing portion 74 is biased in one circumferential direction (i.e., the clockwise direction shown in FIG. 14) about rotation fulcrum 74a by an elastic member (not shown), so that in the initial state, second pushing portion 74 is maintained with a predetermined phase without coming in contact with contact rollers 72e, 72f of transfer portion 72. Two guide pins 74b are arranged on the front side of second pushing portion 74. Each guide pin 74b comes in contact with and supports temporary tape 250 from the inner side.

The curved back portions of first pushing portion 73 and second pushing portion 74 come into contact with contact rollers 72e, 72f, respectively, when transfer portion 72 transfers the leading end of temporary tape 250, and rotates in the other circumferential direction (i.e., the counterclockwise direction shown in FIG. 14). In this case, inner support pin mechanism 73b and each guide pin 73c of first pushing portion 73, and guide pins 74b of second pushing portion 74 are moved to the outer peripheral side of main body plate 71. That is, first pushing portion 73 and second pushing portion 74 pushes a portion of temporary tape 250 pulled by the transfer of transfer portion 72 to the outer peripheral side in conjunction with the rotation of transfer portion 72. As a result, first pushing portion 73 routes temporary tape 250 along a path that follows the transfer path of cover tape 220. In addition, second pushing portion 74 forms an opposing portion facing the leading end of cover tape 220 at a portion of temporary tape 250 that couples with cover tape 220.

In temporary tape routing device 70, in the initial state (i.e., a state in which the rotation angle of transfer portion 72 around rotation fulcrum 72a is zero), as shown in FIG. 14, while gripping claw 72b of transfer portion 72 grips the leading end of temporary tape 250 protruding from the pair of temporary tape support rollers 71e, first pushing portion 73 and second pushing portion 74 are each maintained at an initial angle.

Figure 16:
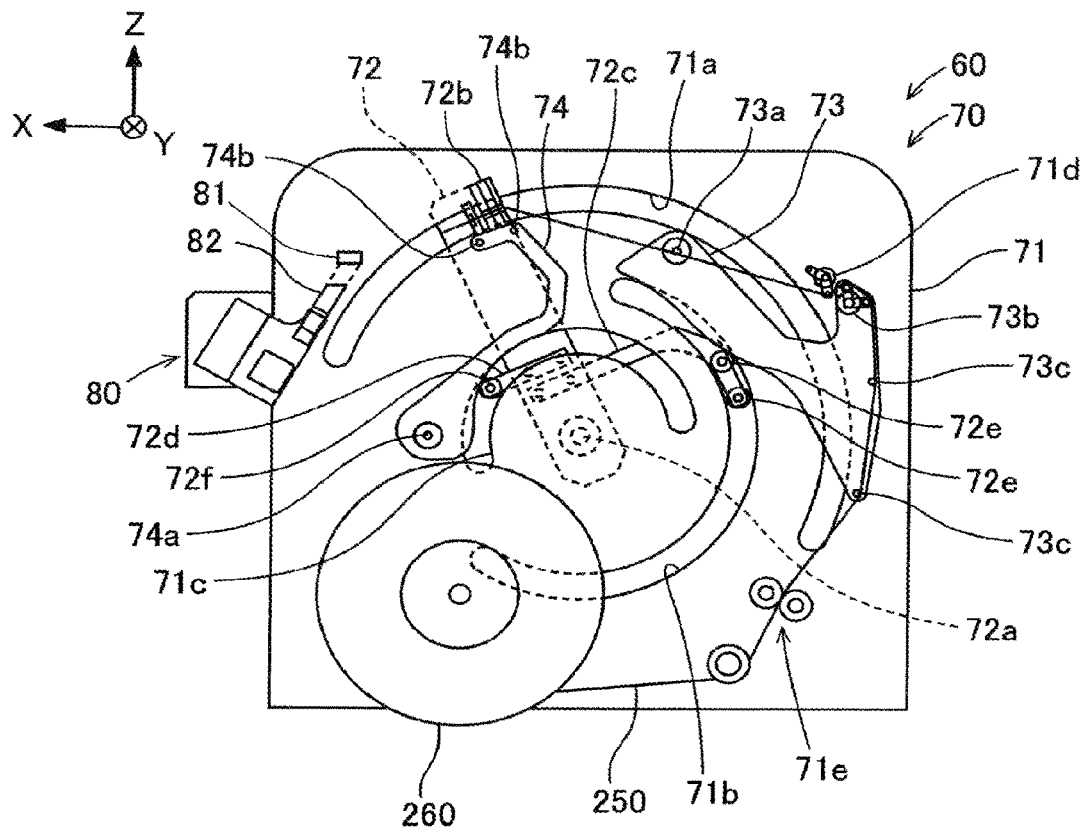
FIG. 16 A side plane view of the initial operational state of the temporary tape routing device provided in the cover tape processing device.

Then, from the initial state, when transfer portion 72 is driven to rotate, temporary tape 250 gripped by gripping claw 72b is sequentially pulled out from temporary tape reel 260 by tension, the leading end of temporary tape 250 is transferred via first position P1 and second position P2 with the pair of temporary tape support rollers 71e as a starting point. Then, when transfer portion 72 rotates by about 140°, as shown in FIG. 16, contact rollers 72e, 72f of transfer portion 72 come into contact with and interlocks with first pushing portion 73 and second pushing portion 74. When this occurs, inner support pin mechanism 73b and guide pin 73c of first pushing portion 73 pushes temporary tape 250 gradually to the outer peripheral side. Second pushing portion 74 is interlocked with contact roller 72f but is in a non-contact state with temporary tape 250 at this stage.

Figure 17:
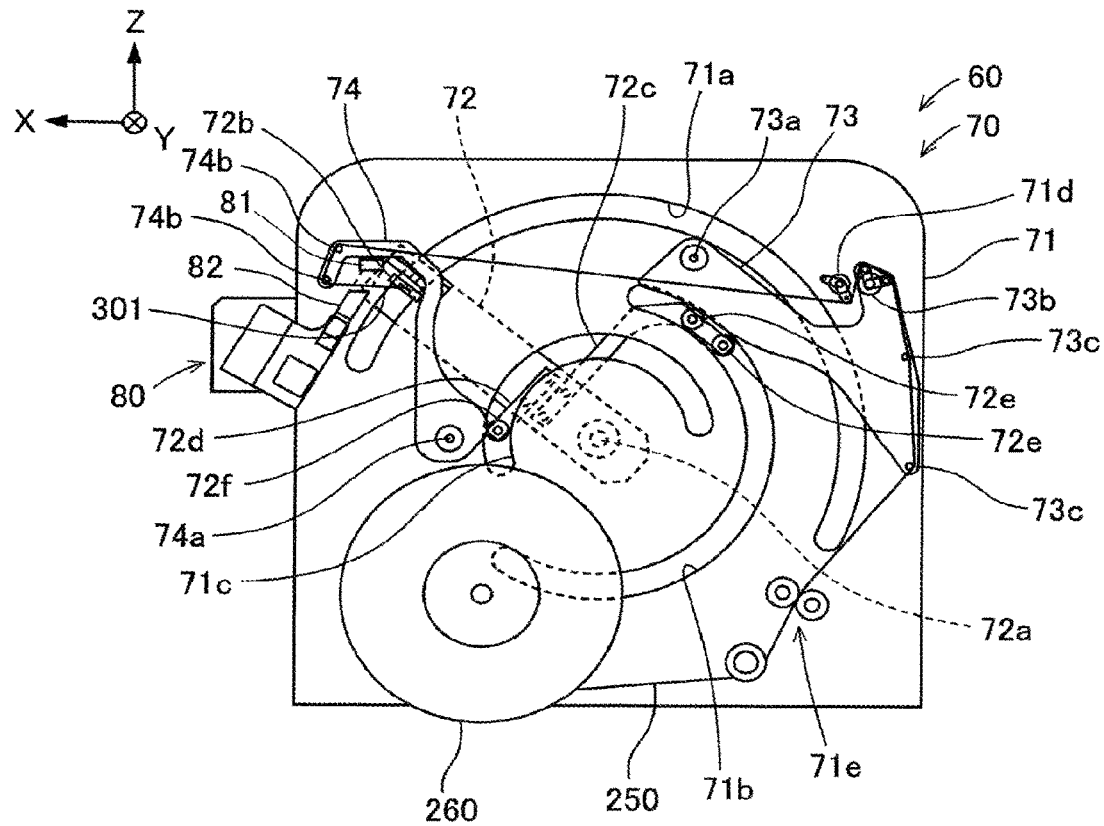
FIG. 17 A side plane view of a later operational stage of the temporary tape routing device provided in the cover tape processing device.

Further, when transfer portion 72 is rotated about 165° from the initial state, as shown in FIG. 17, the leading end of temporary tape 250 is moved to third position P3. When such processing is executed, temporary tape 250 is pulled out by transfer portion 72 to a position corresponding to first tape holding portion 133 of tape feeder 100. Temporary tape 250 is formed in such a manner that a part of temporary tape 250 tightened by the transfer is further pulled by first pushing portion 73 and is routed into a shape along a path following the discharge path of cover tape 220.

More specifically, temporary tape 250 is formed into an S-shape by outer support pin mechanism 71d of main body plate 71 and inner support pin mechanism 73b of first pushing portion 73. When this occurs, each pin 73f, 73g in inner support pin mechanism 73b is maintained at the initial spacing by tension spring 73h. Then, in a state where transfer portion 72 is rotated about 165° from the initial state, as shown in FIG. 17, while a part of the temporary tape 250 tightened by the transfer is pulled by guide pin 74b of second pushing portion 74, temporary tape 250 is formed into a U-shape so as to face cover tape 220 when temporary tape 250 is coupled to cover tape 220 later. In this way, temporary tape routing device 70 interlocks first pushing portion 73 and second pushing portion 74 by rotating transfer portion 72, forming temporary tape 250 into a predetermined shape following the discharge path, whereby temporary tape 250 is routed along the path of the predetermined shape and held in place.

Cover tape gripping device 75 is a device for gripping the leading end of cover tape 220 peeled off from base tape 210. Cover tape gripping device 75 is attached to main body plate 71 of temporary tape routing device 70 which is fixed to pedestal 61. Cover tape gripping device 75 is attached to the side of tape conveyance device 30 fixed to pedestal 34 and may be made to advance in orthogonal direction Y when gripping is required.

Cover tape gripping device 75 has two members, each having a block shape, which can be separated from each other in up-down direction Z. Cover tape gripping device 75 grips cover tape 220 peeled from base tape 210 between both members. Cover tape gripping device 75 is attached to main body plate 71 so as to be capable of advancing and retracting in orthogonal direction Y, cover tape gripping device 75 is controlled to advance and retract in orthogonal direction Y. The attachment position of cover tape gripping device 75 on main body plate 71 is a position in which the leading end of cover tape 220, protruding from first tape holding portion 133 of tape feeder 100 in conveyance direction X, can be gripped. Cover tape gripping device 75 is retracted so as not to interfere with the rotation of second pushing portion 74 before gripping cover tape 220 and is caused to advance so as to be able to grip cover tape 220 when necessary. In addition, the two members of cover tape gripping device 75 are spaced from each other until the advancing in orthogonal direction Y is completed, and abut against each other after the advancing is completed. When such contact is made, the leading end of cover tape 220 is gripped by cover tape gripping device 75.

Connecting device 80 is a device that couples temporary tape 250, held as described above by temporary tape routing device 70, to the leading end of cover tape 220 peeled from base tape 210 of carrier tape 200 at first tape holding portion 133 of tape feeder 100. This coupling is achieved by heating and adhering cover tape 220 and temporary tape 250.

Connecting device 80 is attached to main body plate 71 of temporary tape routing device 70 fixed on pedestal 61. Connecting device 80 includes tape support member 81 and heating member 82. At least one of tape support member 81 and heating member 82 may be attached to tape conveyance device 30 fixed on pedestal 34 instead of main body plate 71. In this case, connecting device 80 attached to tape conveyance device 30 may be advanced in orthogonal direction Y when a connection is required.

Tape support member 81 is a tape presser for supporting the leading ends of both tapes 220, 250 while tapes 220, 250 are overlapped with each other when cover tape 220 and temporary tape 250 are being connected. Tape support member 81 is a member having a rectangular block shape. Tape support member 81 is retractably installed on main body plate 71 in orthogonal direction Y. The installation position of tape support member 81 on main body plate 71 is inside the U-shaped portion of temporary tape 250 formed into a U-shape by temporary tape routing device 70, and is above the leading end of cover tape 220 protruding in conveyance direction X from first tape holding portion 133 of tape feeder 100. Tape support member 81 can be controlled to advance or retract in orthogonal direction Y. Tape support member 81 is retracted so as not to interrupt the rotation of second pushing portion 74 before temporary tape routing device 70 holds temporary tape 250 along a predetermined path, and is advanced so as to support tapes 220, 250 after temporary tape routing device 70 holds temporary tape 250.

Heating member 82 is a member for heating and bonding cover tape 220 and temporary tape 250 by sandwiching the leading end of cover tape 220 and the leading end of temporary tape 250 between heating member 82 and tape support member 81. Heating member 82 is a member having an arm shape. Heating member 82 is attached to main body plate 71 such that heating member 82 can be lifted and lowered in up-down direction Z. Heating member 82 is disposed on main body plate 71 so as to overlap with the rotational position of second pushing portion 74 of temporary tape routing device 70. This layout position is a position that overlaps tape support member 81 at the forward position of tape support member 81. Heating member 82 can be controlled to move in an up-down direction in a removable manner from tape support member 81 in the forward position. Heating member 82 is positioned below before the heating and bonding described above, and is moved obliquely upward, when heating and bonding are required, until its upper face comes into contact with the lower face of tape support member 81.

Heating member 82 has an upper face matching the lower face of tape support member 81. It is possible to sandwich the leading end of cover tape 220 and leading end of temporary tape 250 in an overlapped manner in between the upper face of heating member 82 and the lower face of tape support member 81. The upper face of heating member 82 can be controlled to be heated to a predetermined temperature of, for example, 170° C.

Transfer device 90 is a device for transferring temporary tape 250 coupled to the leading end of cover tape 220 from temporary tape routing device 70 to tape feeder 100. Transfer device 90 performs transfer processing of temporary tape 250 by controlling the operation of temporary tape routing device 70 and the operation of second release device 50.

Next, the operation of tape autoloading device 1 will be described with reference to FIGS. 18 to 36. In tape autoloading device 1, in the initial state, as shown in FIG. 1, any one of transfer device 400 of automatic tape processing device 20, tape conveyance device 30, first release device 40, second release device 50, and cover tape processing device 60 are spaced apart from feeder holding stand 10 by a predetermined distance in orthogonal direction Y. Further, abutting member 321 of guide device 320 of tape leading-end processing device 300, scraper 341 of peeling device 340, cutter 351 of cutting device 350, and transfer device 400 are held in a lowered position. Further, temporary tape routing device 70 of cover tape processing device 60 forms and holds in place temporary tape 250 in advance in a shape along a path following the discharge path of cover tape 220 by the above-described operation. The forming and or holding in place of temporary tape 250 by temporary tape routing device 70 may be performed in time for temporary tape 250 to be coupled with cover tape 220 by connecting device 80, and may be performed, for example, at the same time as the conveyance of carrier tape 200 by tape feeder 100.

In the initial state described above, the operator sets tape feeder 100 to feeder holding table 10. Specifically, the bottom surface of the feeder body 110 is sandwiched by placing between a pair of support guides 13 on the mounting portion 11, the positioning pin and the communication connector of the feeder main body 110 to the positioning portion 15 and the communication jack 14 of the contact portion 12 respectively plugged. Then, tape reel 240 is attached to reel accommodating portion 120, and a feeder set completion button provided in the control device of tape autoloading device 1 is pressed.

Figure 18:
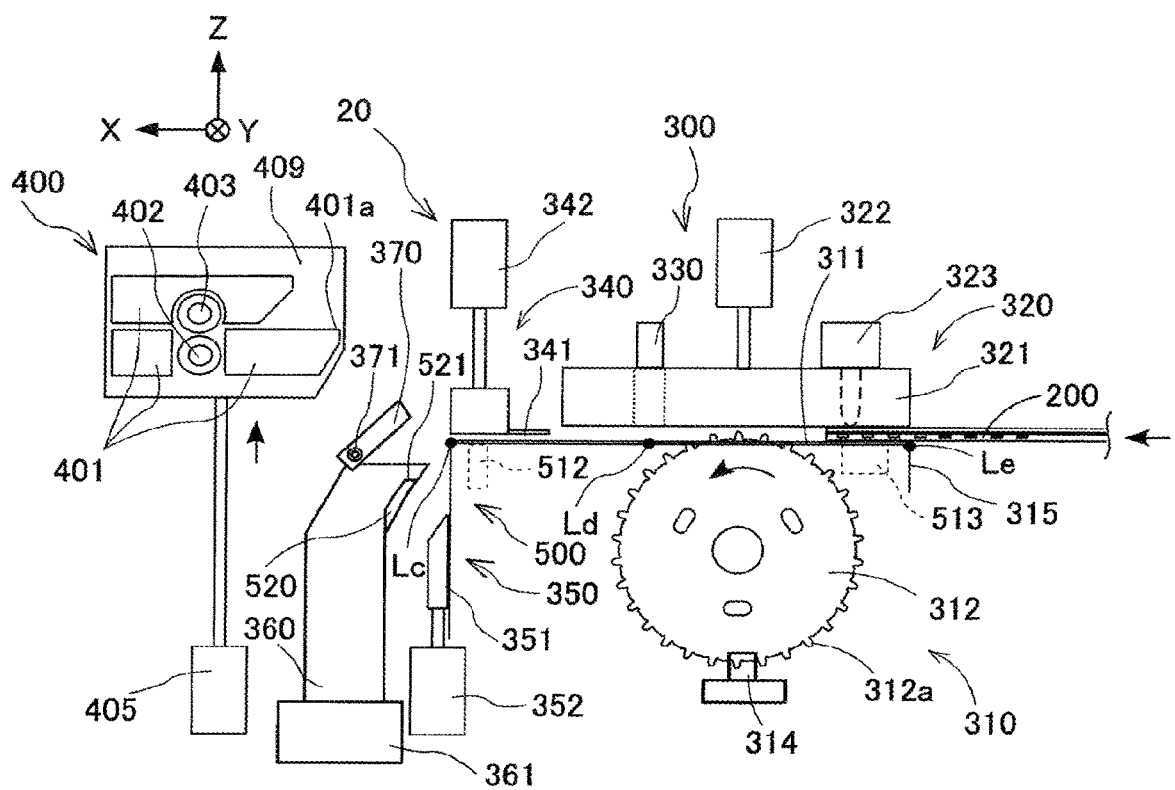
FIG. 18 A diagram showing the operation of inserting carrier tape into the automatic tape processing device.

When the feeder set completion button is pressed, support plate 409 of transfer device 400 is lifted by lifting/lowering air cylinder 405 and positioned at the retraction position in automatic tape processing device 20. At this time, guide 370 of tape leading-end processing device 300 is held in a conveyance prohibited position for prohibiting carrier tape 200 from being conveyed in conveyance direction X. Then, in feeding device 310, the rotational driving of sprocket 312 is started and sprocket tooth detecting device 314 detects whether sprocket 312 has reached the home position. When sprocket 312 reaches its home position, rotation of sprocket 312 is stopped. Next, in guide device 320, it is determined by an operator using tape detection sensor 323 whether the leading end of carrier tape 200 is inserted into tape inlet Le of conveyance member 315. Then, as shown in FIG. 18, when the leading end portion of carrier tape 200 is inserted into tape inlet Le, the rotational driving of sprocket 312 is started.

Figure 19:
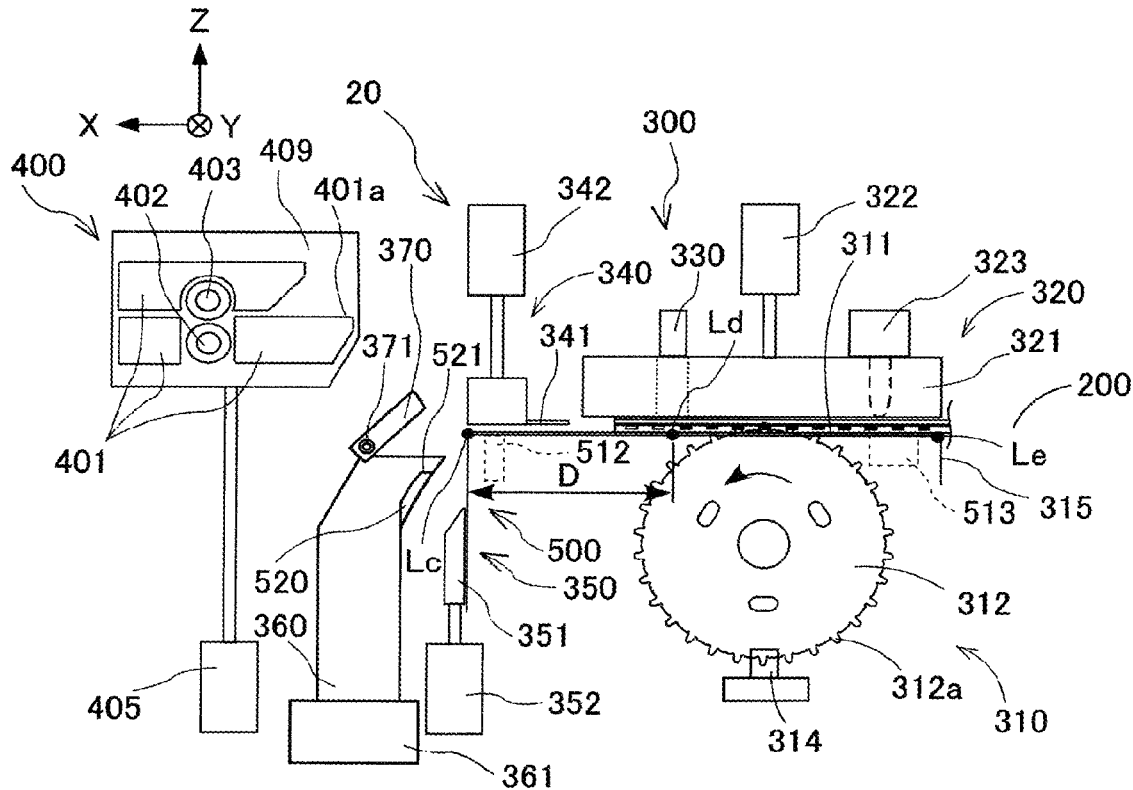
FIG. 19 A diagram showing the operation of detecting the carrier tape in the automatic tape processing device.

During the rotational driving of sprocket 312, detection device 330 determines whether carrier tape 200 has transitioned from having accommodation holes 211 not containing components to having accommodation holes 211 containing components. Then, when a transition to accommodation holes 211 containing components is detected as shown in FIG. 19, cutting point Q1 on carrier tape 200 is calculated based on a predetermined distance from the leading end of base tape 210 to the first accommodation hole 211 containing a component and the distance between known detection position Ld and cutting point Lc.

Figure 20:
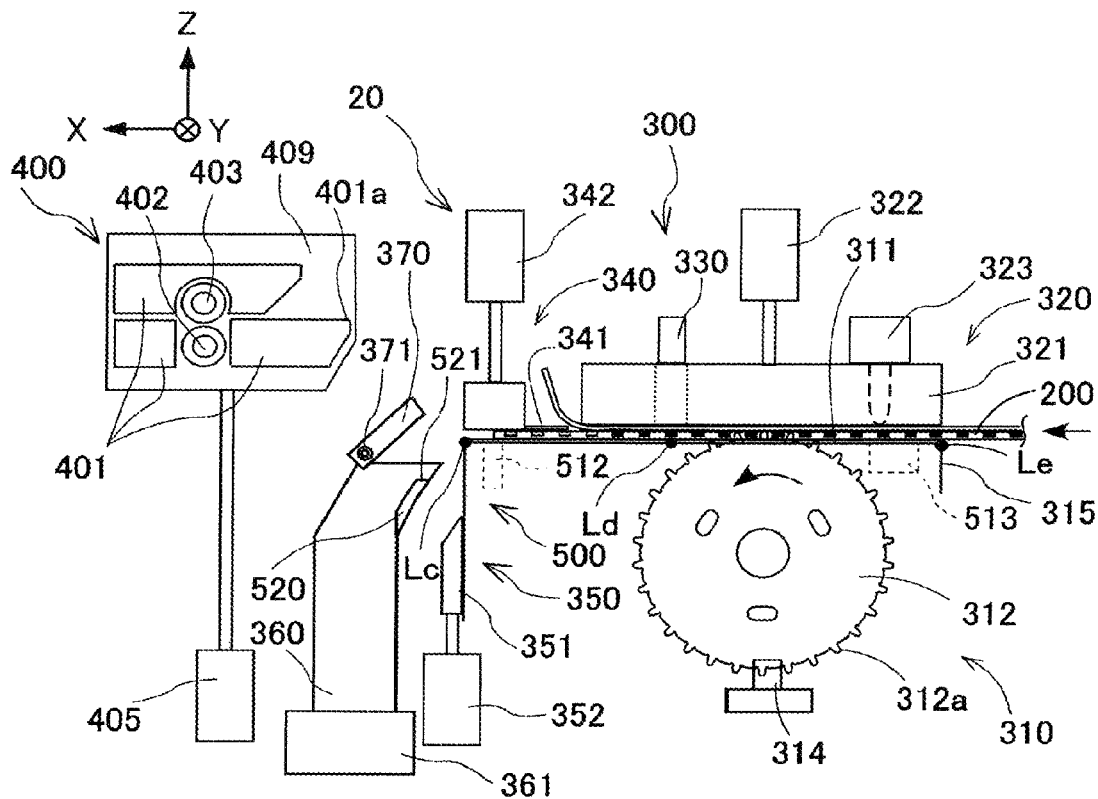
FIG. 20 A diagram showing the operation of peeling the cover tape in the automatic tape processing device.
Figure 21:
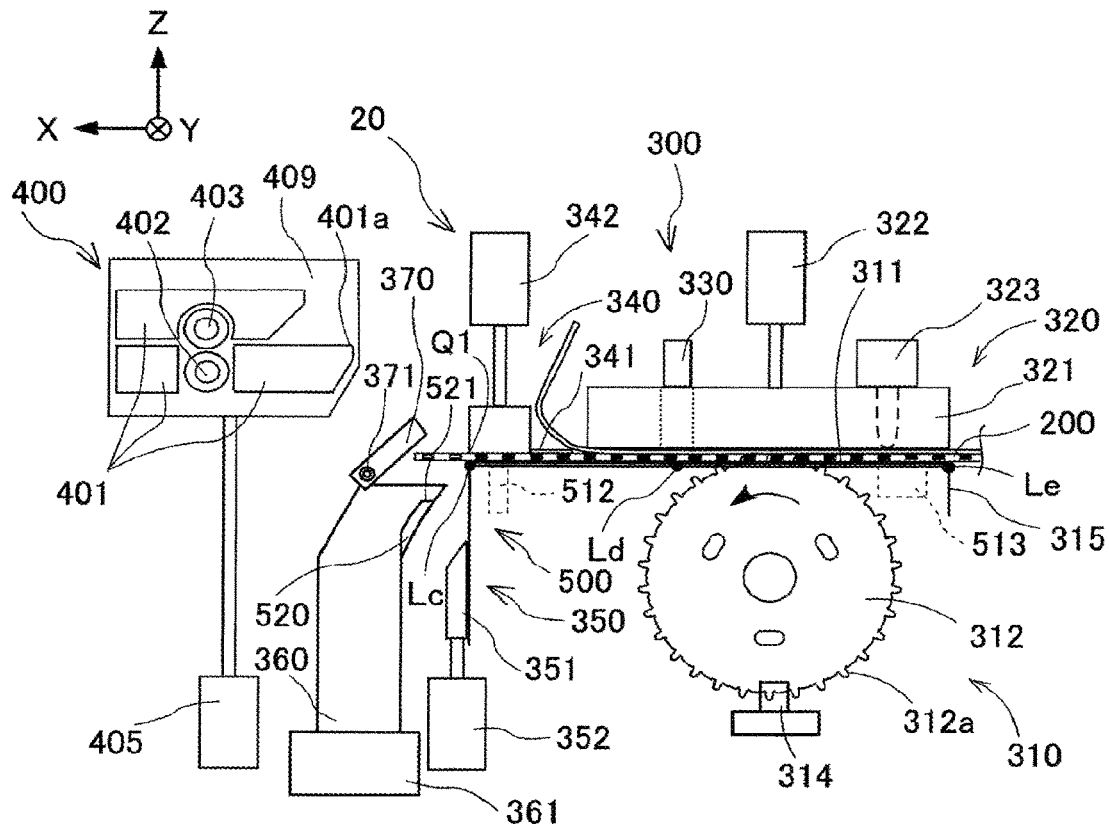
FIG. 21 A diagram showing the operation of positioning a cutting portion of the base tape in the automatic tape processing device.

When carrier tape 200 is conveyed in conveyance direction X by feeding device 310, as shown in FIG. 20, cover tape 220 is peeled off from base tape 210 by scraper 341 which is positioned at the entry height of peeling device 340. Peeled cover tape 220 is folded above peeling device 340 and is made to stand by temporarily. Then, as shown in FIG. 21, when the conveyance of carrier tape 200 by feeding device 310 is advanced and cutting point Q1 of base tape 210 is conveyed and positioned to cutting position Lc, the rotation of sprocket 312 is stopped.

Figure 22:
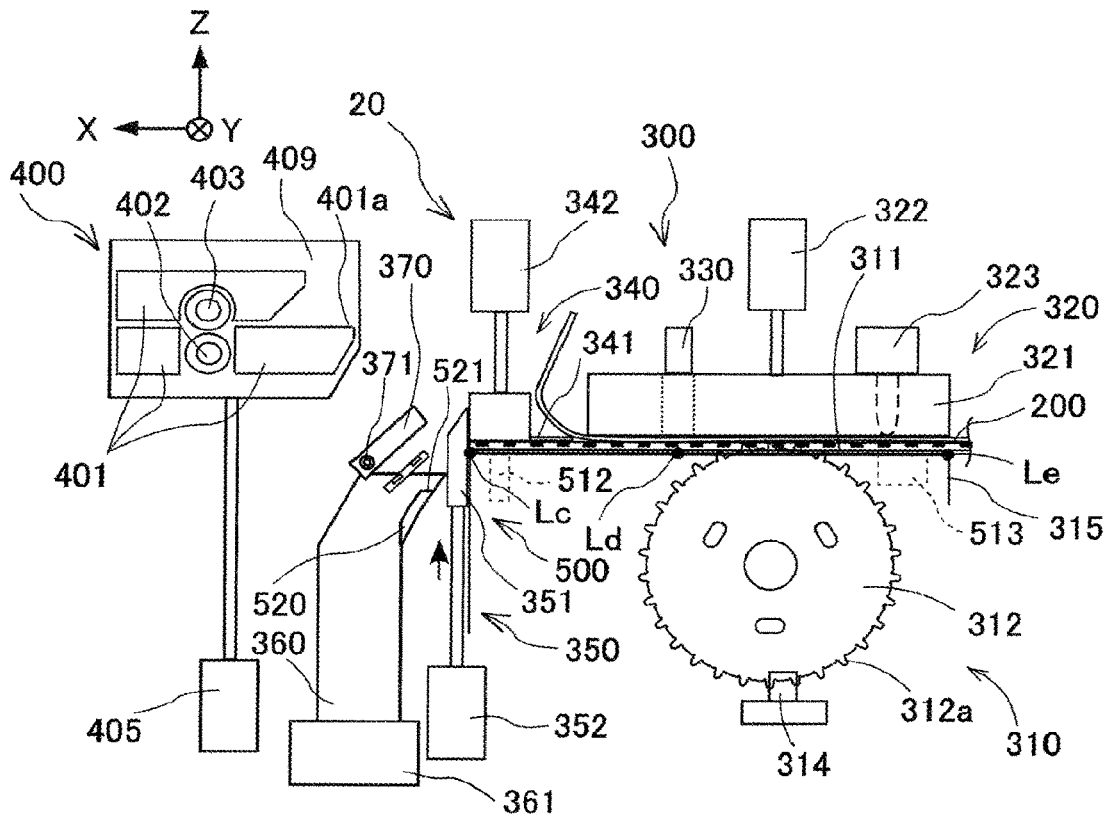
FIG. 22 A diagram showing the operation of cutting the base tape in the automatic tape processing device.

Next, as shown in FIG. 22, in cutting device 350, cutting portion Q1 of base tape 210, positioned at cutting position Lc, is cut by cutter 351 being lifted by air cylinder 352. Cut portion of cut base tape 210 is discharged into duct 360 through the upper end opening, which is opened by guide 370 held in the conveyance prohibiting position, and the cut portion is contained inside waste box 361.

Figure 23:
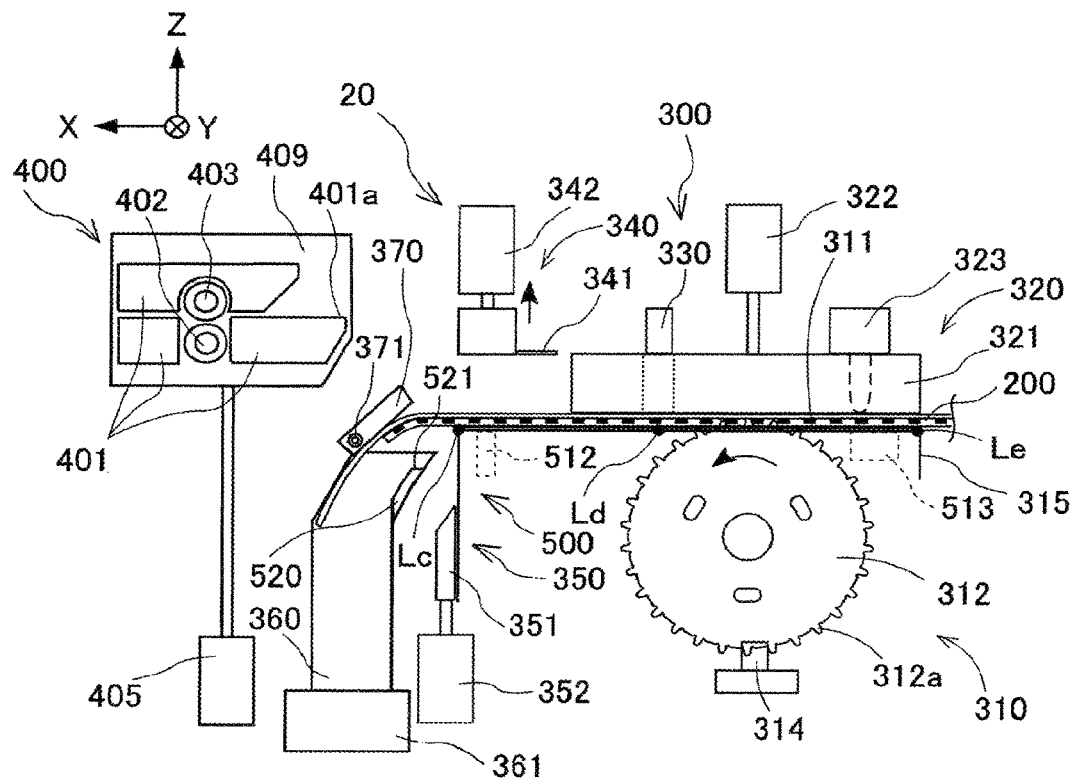
FIG. 23 A diagram showing the operation at the time at which a cover tape protrusion occurs in the automatic tape processing device.

Thereafter, as shown in FIG. 23, scraper 341 of peeling device 340 is lifted to a retraction height, and sprocket 312 is rotated by a predetermined angle. In this case, as a result of carrier tape 200 being conveyed in conveyance direction X by a predetermined distance, cover tape 220, which has been temporarily on standby above peeling device 340, is fed downstream in the conveyance direction. As this occurs, since guide 370 is held in the conveyance prohibiting position, the leading end of carrier tape 200 enters duct 360 without being conveyed in conveyance direction X along the upper face of guide 370. When carrier tape 200 is conveyed a predetermined distance, the rotation of sprocket 312 is stopped and then reverse rotation of sprocket 312 is started.

Figure 24:
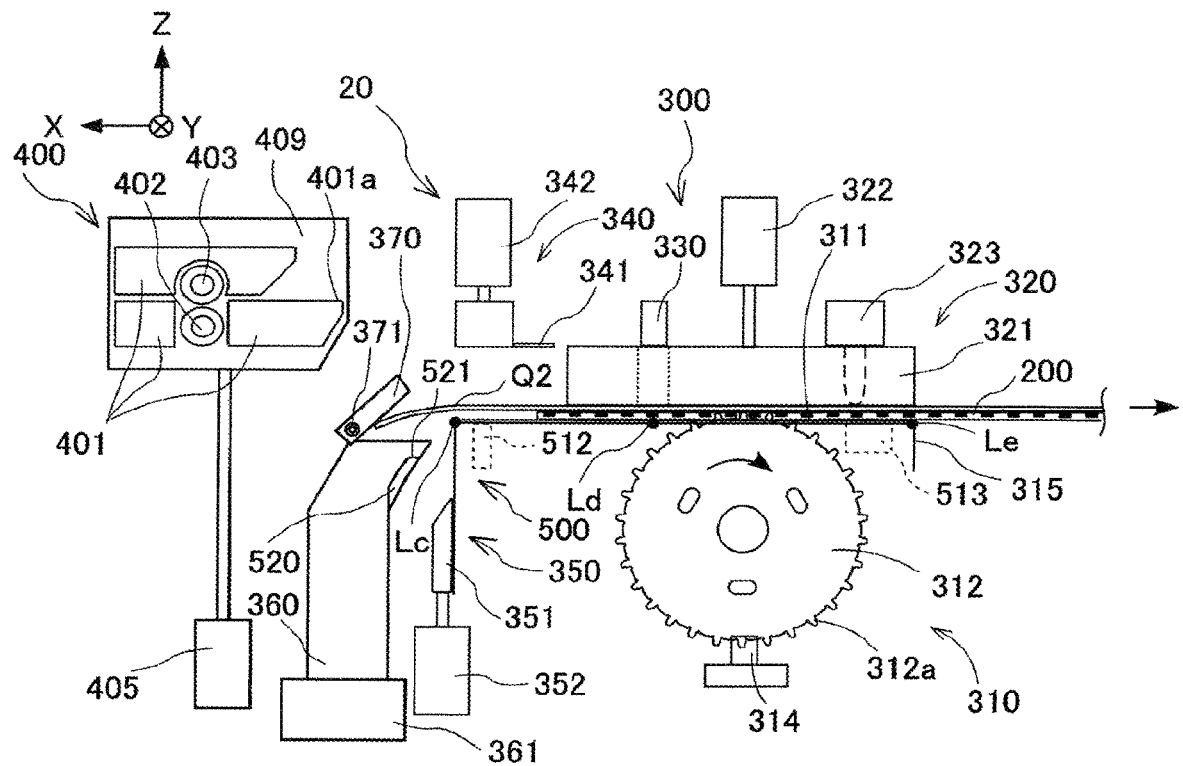
FIG. 24 A diagram showing the operation of positioning a cutting portion of the cover tape in the automatic tape processing device.

Cutting point Q2 of cover tape 220 is calculated so that cover tape 220 protrudes by a predetermined protruding length set in advance from the leading end of base tape 210, which was cut at cutting point Q1 described above. As shown in FIG. 24, after cutting portion Q2 of cover tape 220 is conveyed and positioned to cutting position Lc by carrier tape 200 being conveyed, by feeding device 310, in the opposite direction of conveyance direction X, the reverse rotation of sprocket 312 is stopped.

Figure 25:
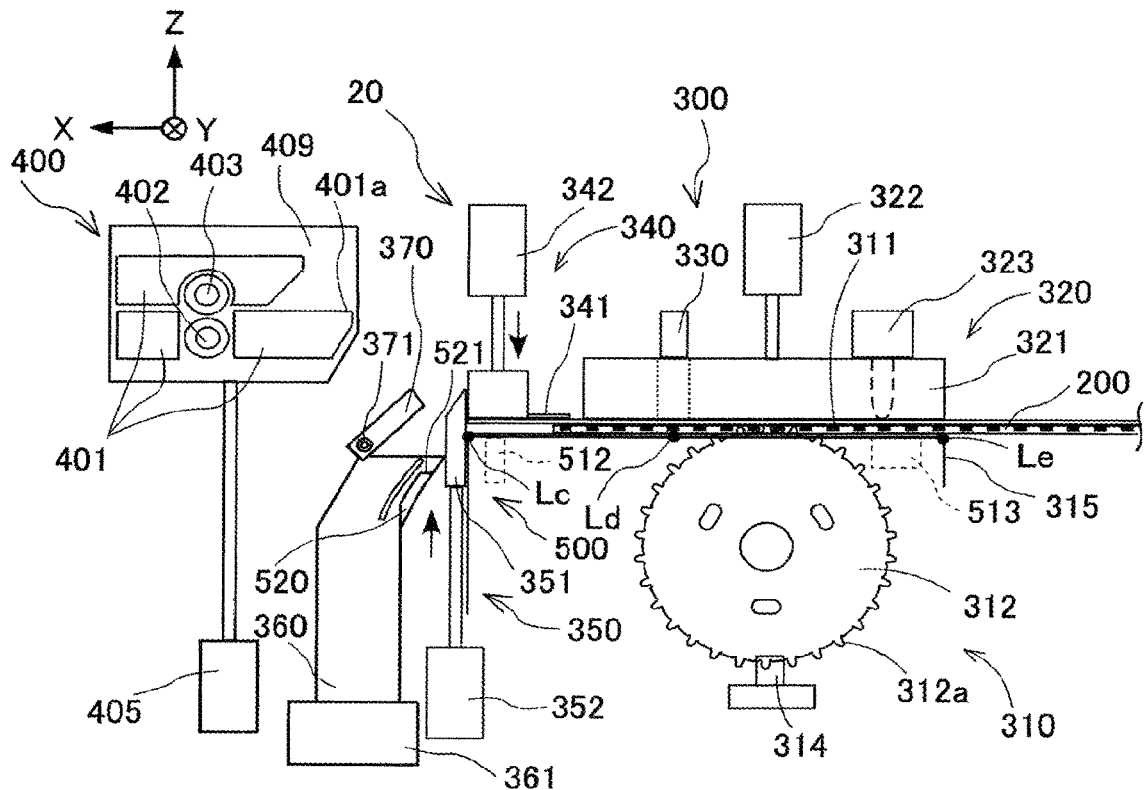
FIG. 25 A diagram showing the operation of cutting the cover tape in the automatic tape processing device.
Figure 26:
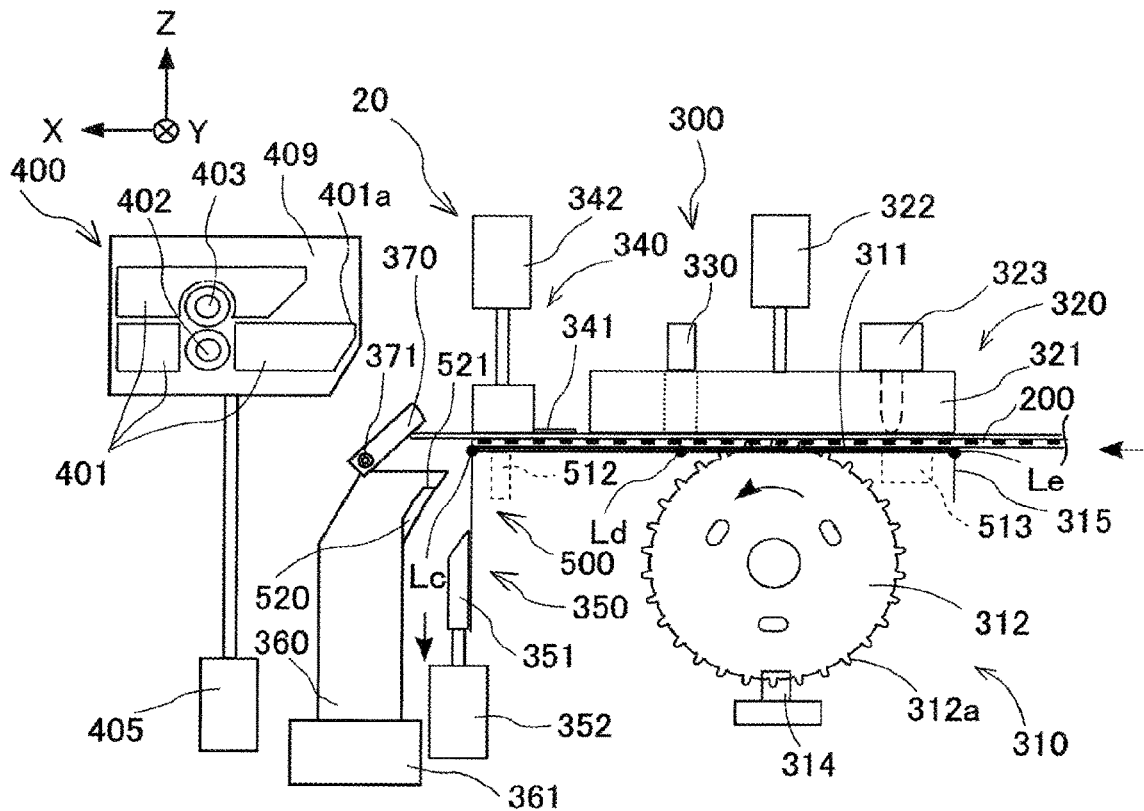
FIG. 26 A diagram showing the operation of the start of folding of the cover tape in the automatic tape processing device.

Then, as shown in FIG. 25, scraper 341 is lowered by peeling device 340 and cutter 351 is lifted by cutting device 350, whereby cutting portion Q2 of cover tape 220 positioned at cutting position Lc is cut. Cut portion of cut cover tape 220 is discharged into duct 360 through the upper end opening, which is opened by guide 370 held in the conveyance prohibiting position, and the cut portion is contained inside waste box 361. Then, after cutting cover tape 220 as described above, rotation of sprocket 312 is started, as shown in FIG. 26, and the leading end of base tape 210 is positioned at cutting position Lc. When the leading end of base tape 210 is positioned at cutting position Lc, rotation of sprocket 312 is stopped.

Figure 27:
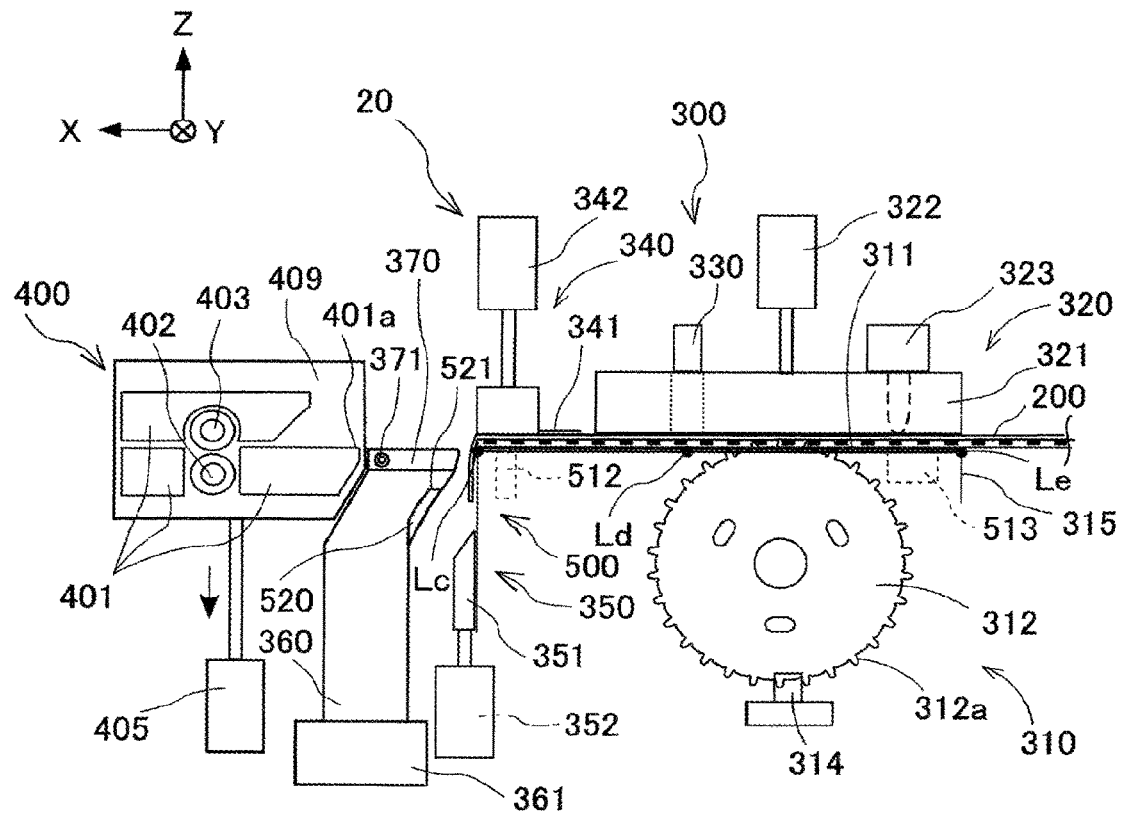
FIG. 27 A diagram showing the operation during folding of the cover tape in the automatic tape processing device.
Figure 28:
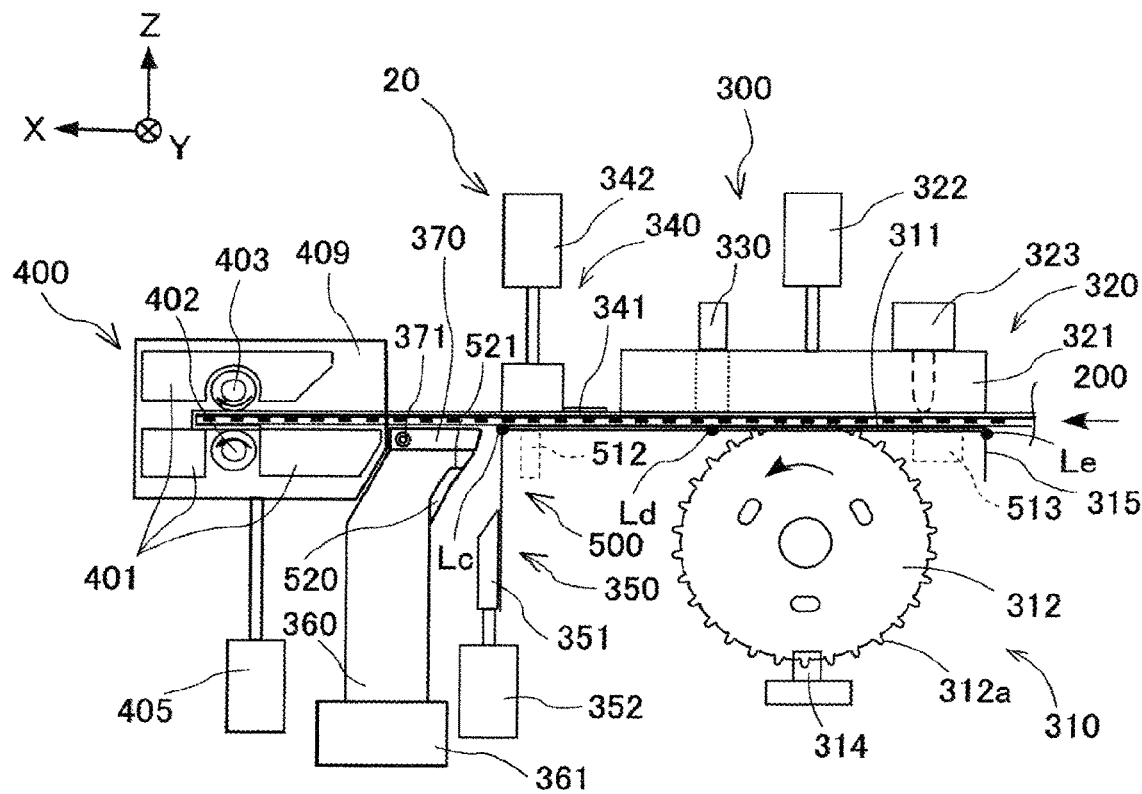
FIG. 28 A diagram showing the operation before transferring of the carrier tape in the automatic tape processing device.

Next, as shown in FIG. 27, by lowering support plate 409 of transfer device 400, tape convey-in port 401a of guide 401 aligns with cutting position Lc of conveyance path 311, and guide 370 is rotated from the conveyance prohibiting position to the conveyance permitting position. When this occurs, the portion of cover tape 220 protruding downstream from cutting position Lc in the conveyance direction is pushed downward by guide 370 and allowed to hang downward. Then, as shown in FIG. 28, sprocket 312 is rotated until carrier tape 200 is conveyed along guide 401 and the leading end is held between driving roller 402 and driven roller 403. In this case, in carrier tape 200, protruding portion 220a of cover tape 220 protruding from the leading end of base tape 210 is folded back toward the underside face at the leading end of base tape 210. When the leading end of carrier tape 200 is held between driving roller 402 and driven roller 403, rotation of sprocket 312 is stopped.

Figure 29:
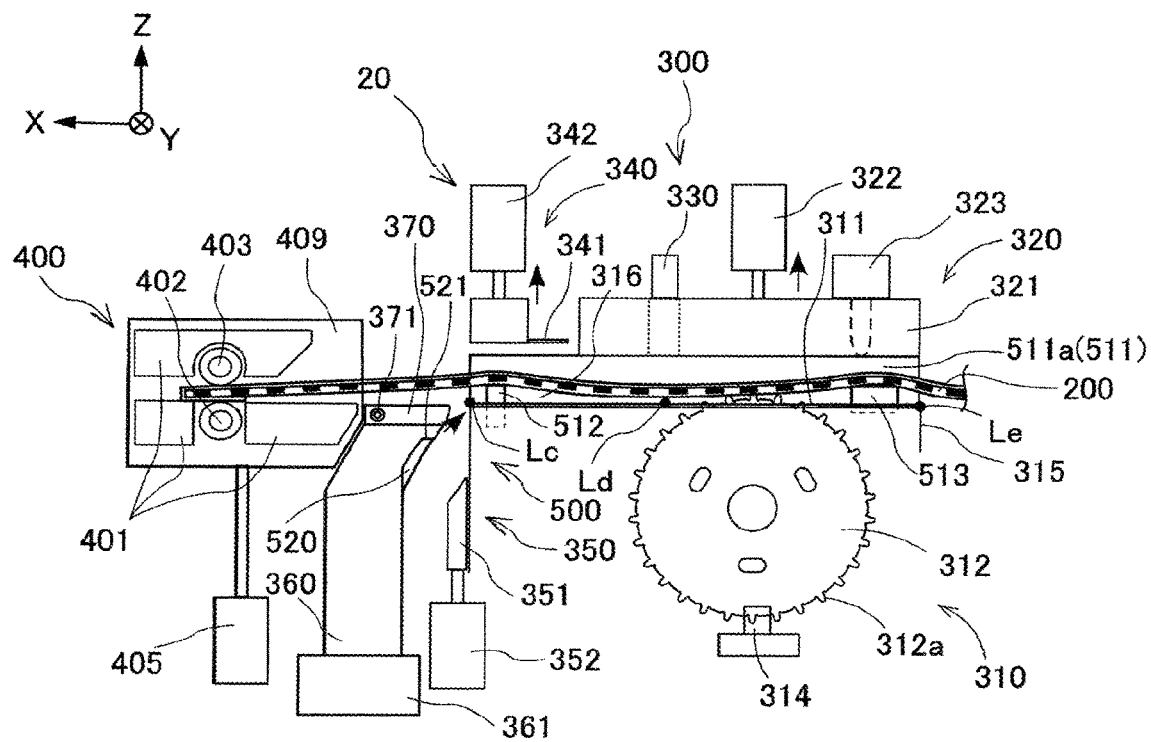
FIG. 29 A diagram showing the operation immediately before starting the transfer of carrier tape in the automatic tape processing device.
Figure 30:
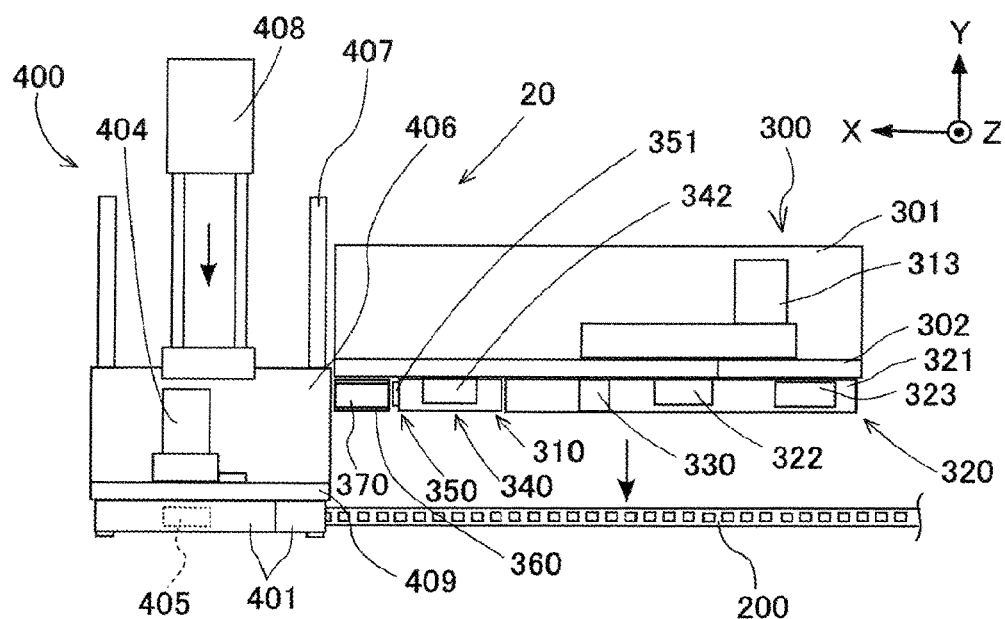
FIG. 30 A diagram showing the operation at the time of transfer of the carrier tape in the automatic tape processing device.

Next, as shown in FIG. 29, abutting member 321 of guide device 320 and scraper 341 of peeling device 340 are each moved up and retracted. When abutting member 321 is lifted, lifting mechanism 510 of lift-up device 500 is lifted in conjunction with the lifting of abutting member 321. At this juncture, carrier tape 200 extending along conveyance path 311 is lifted up by being pressed upward by the upper surface of first lifting portion 512 and the upper surface of second lifting portion 513 of lifting mechanism 510 while the leading end is held between driving roller 402 and driven roller 403.

Further, when lifting mechanism 510 as described above is lifted, air supply device 520 injects positive pressure air from air injection port 521 at substantially the same time as the lifting. Positive pressure air injected from air injection port 521 is guided to lower space 316 formed below carrier tape 200 conveyed along conveyance path 311. When positive pressure air is directed into lower space 316, a pressure difference occurs in the upper and lower spaces sandwiching carrier tape 200 to lift carrier tape 200. When such a pressure difference is generated, carrier tape 200 is easily lifted upward against the force of gravity.

Thus, when the lift-up of carrier tape 200 is performed by lifting mechanism 510 and air supply device 520 of lift-up device 500, the lowermost portion of carrier tape 200 will be positioned above the upper edges of conveyance side walls 315b, 315c of conveyance member 315.

When carrier tape 200 is lifted up as described above, as shown in FIG. 30, pedestal 406 of transfer device 400 is then slid in orthogonal direction Y and brought close to feeder holding table 10. In this case, carrier tape 200 whose leading end is held between driving roller 402 and driven roller 403 is disengaged from conveyance path 311 of feeding device 310 and is moved in orthogonal direction Y toward feeder holding table 10. The movement of carrier tape 200 in orthogonal direction Y is performed while the lowermost portion of carrier tape 200 is positioned above the upper edges of conveyance side walls 315b, 315c of conveyance member 315.

Figure 31:
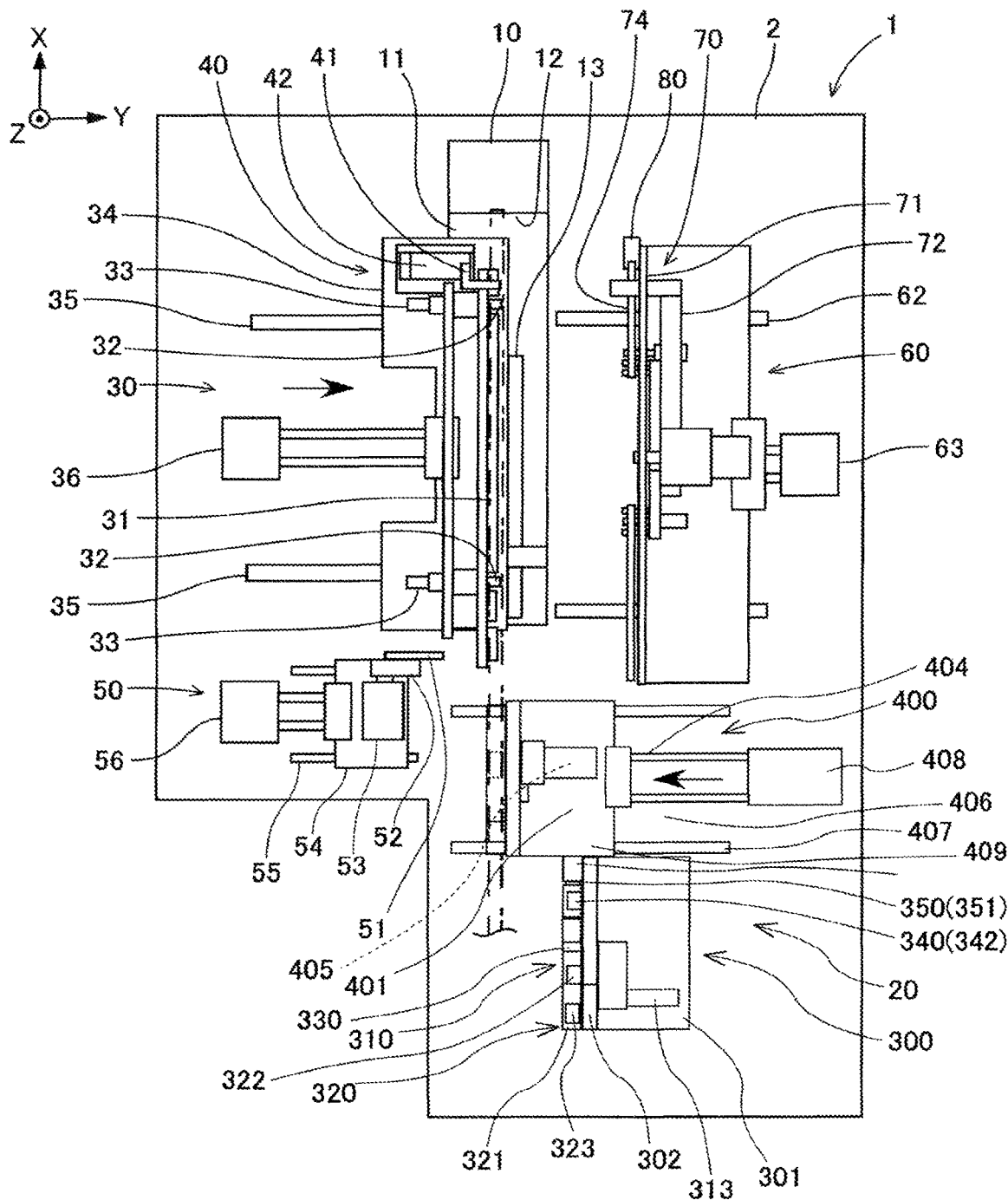
FIG. 31 A top view showing a state in which the transfer device and tape conveyance device of the tape automatic processing device are close to the feeder holding table.

Further, when the sliding movement of transfer device 400 described above is performed, tape conveyance device 30 is controlled to slide in orthogonal direction Y toward feeder holding table 10. Then, as shown in FIG. 31, transfer device 400 and tape conveyance device 30 are each positioned so that the positions of guides 401, 31 in orthogonal direction Y are equal to the position in orthogonal direction Y of tape feed guide 111 of tape feeder 100.

Further, first release device 40 is slid in accordance with the above-described sliding movement of tape conveyance device 30. In this case, first lift lever 41 of first release device 40 is inserted into the actuation allowable side with respect to lever 138 of first tape holding portion 133 of tape feeder 100. Then, when support base 42 of first release device 40 is controlled to rise in up-down direction Z, first lift lever 41 lifts lever 138 of first tape holding portion 133. When lever 138 is lifted, first tape holding portion 133 rotates upward about rotation fulcrum 133a so that the holding of carrier tape 200 between first tape holding portion 133 and sprocket 131 is released.

Then, while gear motor 404 of transfer device 400 is driven, gear motor 33 of tape conveyance device 30 is driven. As a result, carrier tape 200 is fed in conveyance direction X by driving rollers 402, 32, guided by guides 401, 31 and tape feed guide 111, and conveyed through the gap between first tape holding portion 133 and sprocket 131. Carrier tape 200 is transferred from automatic tape processing device 20 to tape feeder 100.

When carrier tape 200 is conveyed to first tape holding portion 133, each of motors 404, 33 is stopped, support base 42 and first lift lever 41 of first release device 40 are controlled to be lowered and lever 138 of first tape holding portion 133 descends. When lever 138 descends, first tape holding portion 133 rotates downward about rotation fulcrum 133a so that carrier tape 200 is held between first tape holding portion 133 and sprocket 131. When motor 132 is driven in such a state, by the rotation of sprocket 131, carrier tape 200 is conveyed so that the leading end of carrier tape 200 protrudes in conveyance direction X by a predetermined amount from first tape holding portion 133.

At this juncture, carrier tape 200 is conveyed in the direction opposite to conveyance direction X, whereby base tape 210 in protruding portion 220a of cover tape 220 is returned to be folded back toward the underside face at the leading end of base tape 210. Then, carrier tape 200 is again conveyed so as to protrude from first tape holding portion 133 in conveyance direction X by a predetermined amount. As a result, protruding portion 220a of cover tape 220 protrudes from the leading end of base tape 210, so that cover tape 220 can be easily peeled off from base tape 210.

Figure 32:
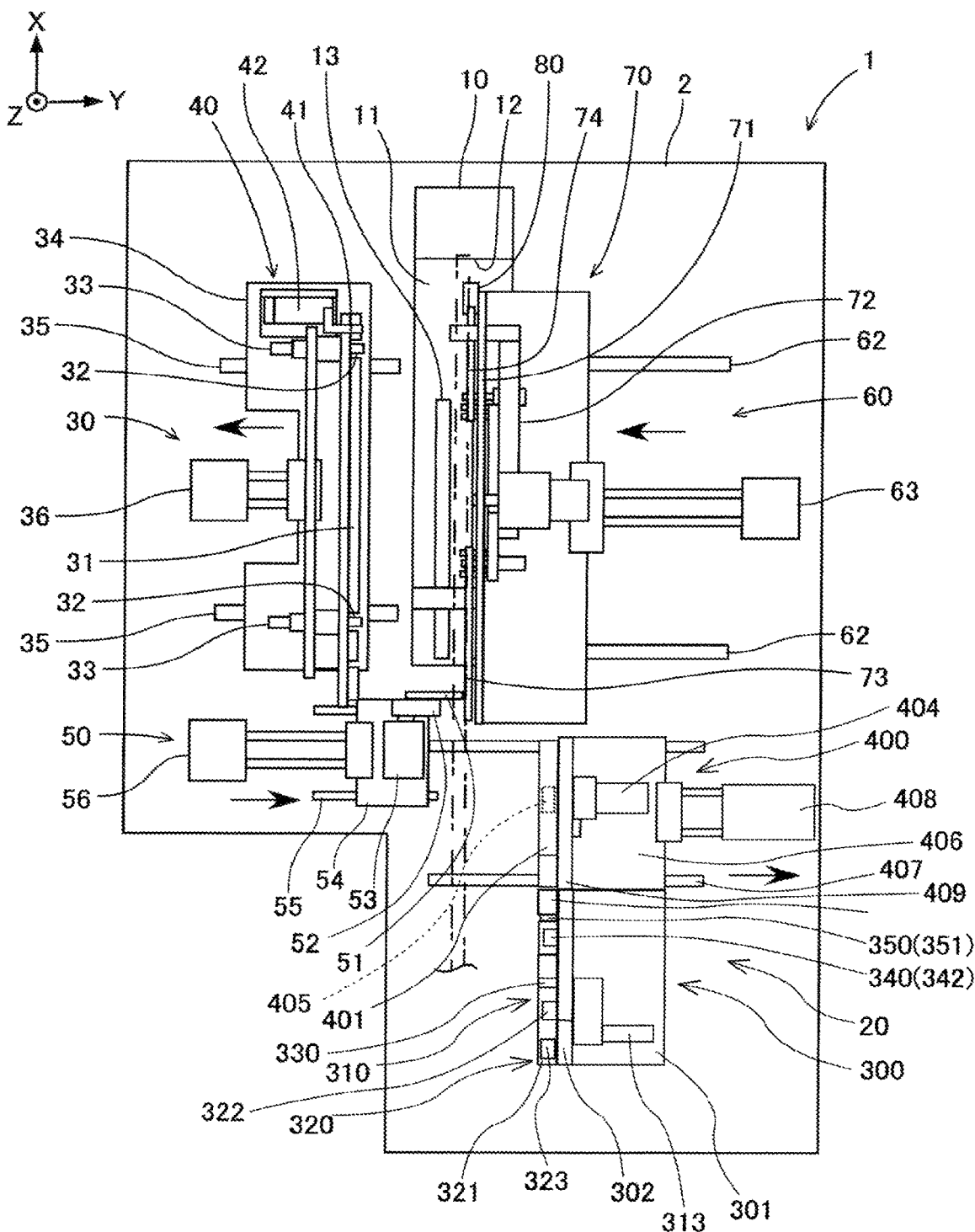
FIG. 32 A top view showing a state in which the second release device and the cover tape processing device are close to the feeder holding table.

Subsequently, as shown in FIG. 32, transfer device 400 of automatic tape processing device 20 and tape conveyance device 30 are each slid in orthogonal direction Y away from feeder holding table 10, and second release device 50 is slid in orthogonal direction Y toward feeder holding table 10. In this case, second lift lever 51 of second release device 50 is inserted into the actuation allowable side with respect to lever 146 of second tape holding portion 143 of tape feeder 100. Then, when support base 52 of second release device 50 is controlled to move in conveyance direction X, arm 145 of second tape holding portion 143 is rotated about rotation fulcrum 145a on the rear end of feeder main body 110 by second lift lever 51. In this case, since gear 144 of second tape holding portion 143 is spaced apart from gear 141 of cover tape feeding mechanism 140, the holding of carrier tape 200 between gear 144 and gear 141 is released.

With gear 144 and gear 141 of cover tape feeding mechanism 140 disengaged, cover tape processing device 60 is slid in orthogonal direction Y toward feeder holding table 10. At this juncture, temporary tape routing device 70 is in a state in which temporary tape 250 is formed in advance and held in a shape along a path following the discharge path of cover tape 220. Then, cover tape processing device 60 is positioned so that the position in orthogonal direction Y of temporary tape 250 held by temporary tape routing device 70 is equal to the position in orthogonal direction Y of carrier tape 200 held by tape feeder 100.

Figure 33:
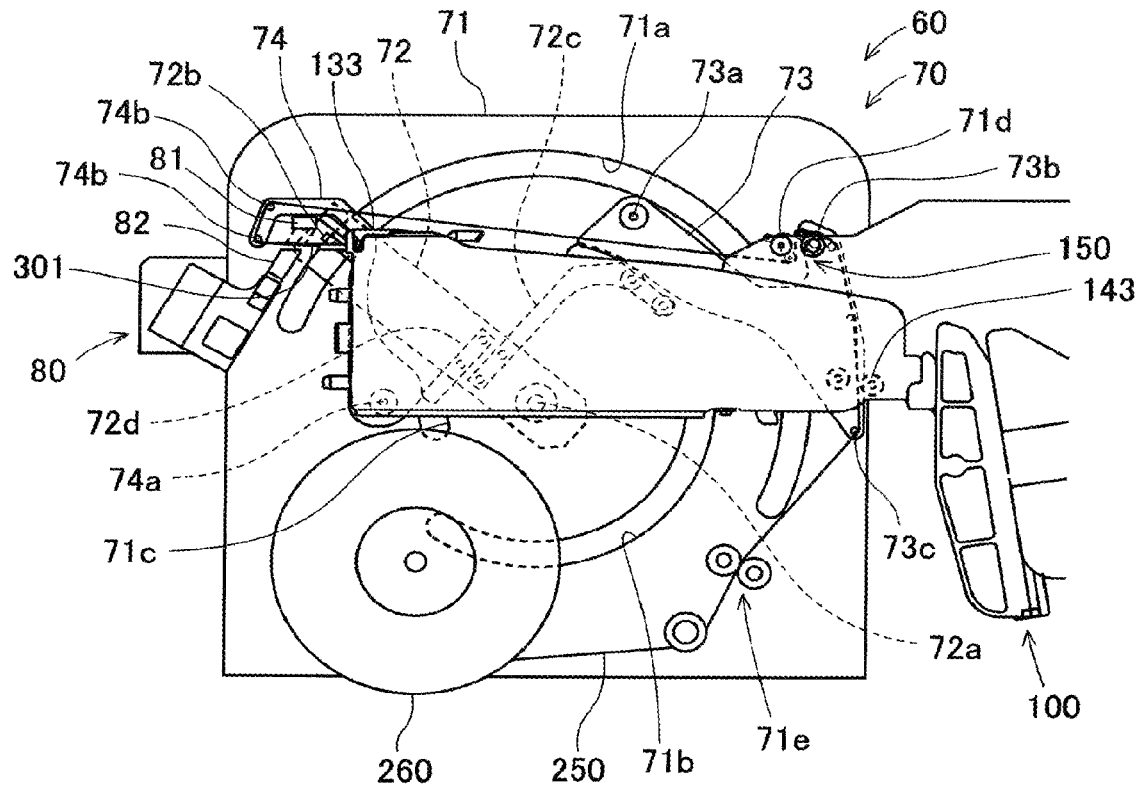
FIG. 33 A side plane view showing he tape feeder and the cover tape processing device, showing a part of cover tape processing device in a see-through manner.
Figure 35:
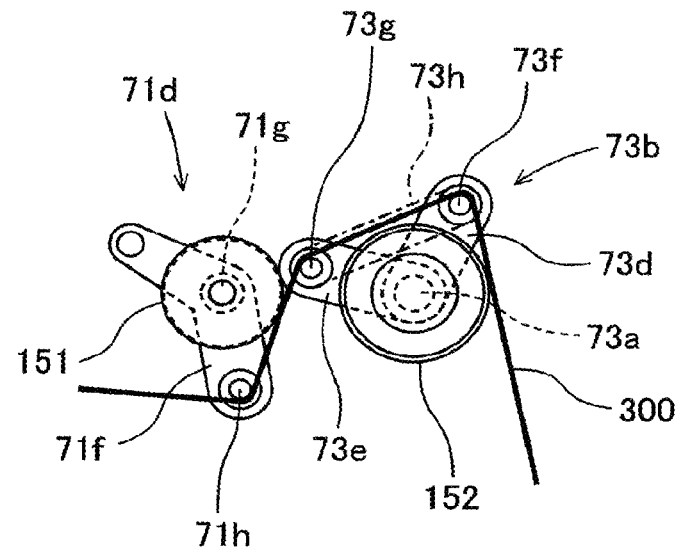
FIG. 35 A diagram showing a state in which the temporary tape is held by multiple pins at the time of transferring the temporary tape to the tape feeder.

This positioning, as shown in FIG. 33, is performed so that the leading end of temporary tape 250 is positioned below the leading end of cover tape 220 protruding in conveyance direction X from first tape holding portion 133 of tape feeder 100, and the leading end of temporary tape 250 faces the leading end of cover tape 220. Further, this positioning is performed so that the two members of cover tape gripping device 75 face each other and sandwich, from the top and bottom, the leading end of cover tape 220 protruding in conveyance direction X from first tape holding portion 133 of tape feeder 100. Furthermore, the portion of temporary tape 250 located between two guide pins 73c of first pushing portion 73 is positioned so as to pass between gear 141 of cover tape feeding mechanism 140 and gear 144 of second tape holding portion 143, which are spaced apart from each other. Furthermore, the portion of temporary tape 250 curved into an S-shape by outer support pin mechanism 71d and inner support pin mechanism 73b, as shown in FIG. 35, is positioned so that temporary tape 250 passes between the two guide rollers 151, 152 of cover tape feed guide 150 in tape feeder 100.

When the above-described positioning is performed, the two members of cover tape gripping device 75 are moved toward each other to grip the leading end of cover tape 220 protruding in conveyance direction X from first tape holding portion 133 of tape feeder 100. Before or after this gripping, tape support member 81 of connecting device 80 is advanced so as to support tapes 220, 250 in orthogonal direction Y. Then, when the leading end of cover tape 220 is gripped and tape support member 81 is advanced, heating member 82 is moved obliquely upward until heating member 82 abuts the lower surface of tape support member 81. When heating member 82 and tape support member 81 come into contact with each other, cover tape 220 and temporary tape 250 are sandwiched between heating member 82 and tape supporting member 81 so as to overlap each other.

When cover tape 220 and temporary tape 250 are sandwiched between heating member 82 and tape support member 81 while heating member 82 is heated, cover tape 220 and temporary tape 250 are heated by heating member 82. When such heating is performed, the adhesive remaining on the peeled surface of cover tape 220 when peeled off from base tape 210 is softened by the heat treatment and again functions as an adhesive. As a result, cover tape 220 and temporary tape 250 are adhered and coupled to each other by an adhesive at a position sandwiched between heating member 82 and tape support member 81.

When cover tape 220 and temporary tape 250 are coupled to each other, heating member 82 is moved obliquely downward and separated from tape support member 81, and tape support member 81 is retracted in orthogonal direction Y. Further, the gripping of temporary tape 250 by gripping claw 72b of transfer portion 72 is released. Thereafter, temporary tape 250 held by temporary tape routing device 70 is transferred to tape feeder 100.

Figure 34:
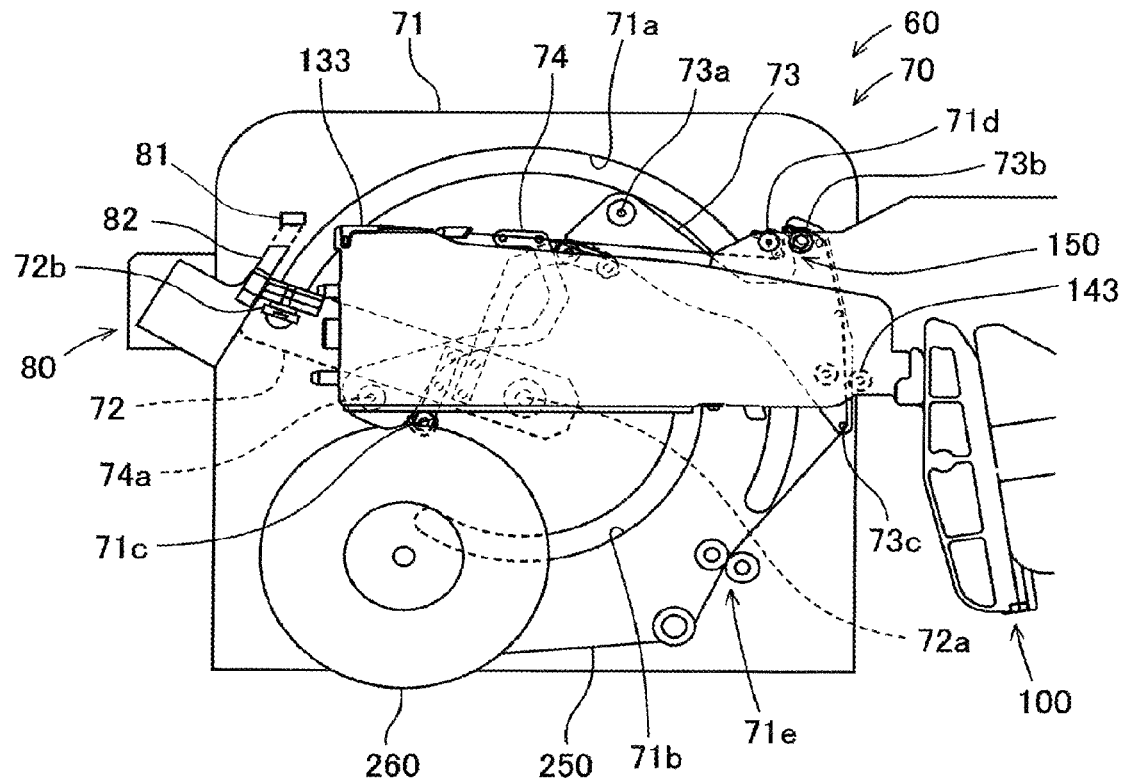
FIG. 34 A diagram showing an operation of transferring the temporary tape to the tape feeder.

Specifically, temporary tape 250 described above is transferred by first being rotated in the same direction as the direction in which transfer portion 72 of temporary tape routing device 70 is rotated from the initial state to third position P3 (i.e., in the counterclockwise direction in FIG. 34). After transfer portion 72 is rotated in such a direction, contact roller 72f of transfer portion 72 disengages from the rear portion of second pushing portion 74, and second pushing portion 74 is rotated in the opposite direction (i.e., the clockwise direction in FIG. 34) by the elastic member and returned to the initial state. When this occurs, temporary tape 250 becomes integrated with cover tape 220, to which temporary tape 250 is coupled, and is supported by pin 71h of outer support pin mechanism 71d while being folded back 180°, with first tape holding portion 133 as a base point, and pulled rearward in conveyance direction X. Thereafter, transfer device 90 rotates temporary tape reel 260 in the opposite direction to the pulling direction of temporary tape 250 (i.e., in the clockwise direction in FIG. 20). As a result of this rotation, loose temporary tape 250 is wound when second pushing portion 74 returns to the initial position.

Figure 36:
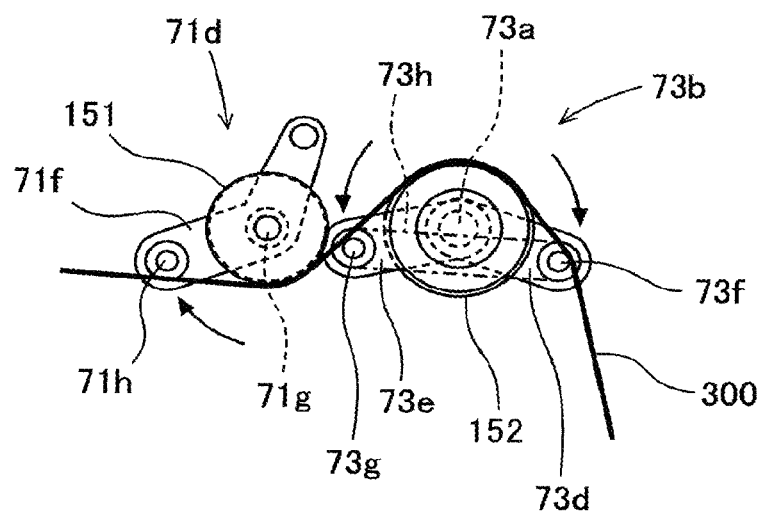
FIG. 36 A diagram showing a state in which the temporary tape is transferred to the guide roller from the cover tape feed guide.

Further, when transfer device 90 rotates temporary tape reel 260 in the reverse direction, the tension of temporary tape 250 increases during the stopping of tape feeding mechanism 130 of tape feeder 100. When the tension of temporary tape 250 increases, as shown in FIG. 36, temporary tape 250 passes on both sides of guide roller 152 of tape feeder 100 while two pins 73f, 73g expand against the elastic force of tension spring 73h of inner support pin mechanism 73b. In this case, temporary tape 250 that was held by two pins 73f, 73g is transferred to guide roller 152. Similarly, pin 71h of outer support pin mechanism 71d is moved to the distal end of tape feeder 100, and temporary tape 250 held by pin 71h is transferred to guide roller 151 of tape feeder 100.

When temporary tape 250 is transferred to tape feeder 100, transfer device 90 operates second release device 50 so as to hold temporary tape 250 in place. When such an operation is performed, arm 145 of second tape holding portion 143 is rotated about rotational fulcrum 145a at the front end side of feeder main body 110 by way of support base 52 of second release device 50 being moved in conveyance direction X by the biasing force of coil spring 147. In this case, temporary tape 250 is held between gear 144 of second tape holding portion 143 and gear 141 of cover tape feeding mechanism 140.

Then, cover tape processing device 60 cuts temporary tape 250 between second tape holding portion 143 and temporary tape reel 260 with a tape cutter (not shown). After this cutting, temporary tape 250 is transferred to tape feeder 100 as shown in FIG. 7. At this time, temporary tape 250 may interfere with carrier tape 200 in the middle of conveying, but it is possible to prevent interference with carrier tape 200 by locking carrier tape 200 to a notch provided in feeder main body 110 so as to straddle carrier tape 200.

After the above cutting, cover tape processing device 60 is moved in orthogonal direction Y away from feeder holding table 10. After the cutting, transfer portion 72 is returned to the initial angle. Further, components accommodated in base tape 210 are fed out and positioned at component suction position L by way of motor 132 driving to rotate sprocket 131. As described above, the automatic setting of carrier tape 200 on tape feeder 100 by tape autoloading device 1 is completed.

With tape autoloading device 1, carrier tape 200 can be automatically loaded into tape feeder 100. Specifically, base tape 210 and cover tape 220 of carrier tape 200 extending along conveyance path 311 are cut by tape leading-end processing device 300 to form the leading end of carrier tape 200 into a predetermined shape, and then carrier tape 200 having the leading end formed into a predetermined shape can be conveyed out in orthogonal direction Y different from the tape longitudinal direction of carrier tape 200 by transfer device 400 and transferred to tape conveyance device 30 and thus to tape feeder 100 held by feeder holding table 10. Further, it is possible to convey carrier tape 200 to tape feeding mechanism 130 by tape conveyance device 30. Furthermore, cover tape 220 can be guided along the discharge path and to the outside of feeder main body 110 by being transferred to tape feeder 100 after temporary tape 250 is heated and adhered to cover tape 220, peeled off from base tape 210 of above-mentioned carrier tape 200, with cover tape processing device 60.

Further, after the leading end of carrier tape 200 is formed in a predetermined shape on conveyance path 311 but before carrier tape 200 is conveyed out in orthogonal direction Y different from the tape longitudinal direction by transfer device 400, carrier tape 200 can be lifted upward by lift-up device 500 while carrier tape 200 is along conveyance path 311. More specifically, carrier tape 200 is lifted by bringing first lifting portion 512 and second lifting portion 513 of lifting mechanism 510 directly into contact with the lower surface of carrier tape 200, and carrier tape 200 can be lifted by supplying positive pressure air from air injection port 521 of air supply device 520 to lower space 316 under carrier tape 200, lifting carrier tape 200 by the pressure difference between the upper and lower spaces.

The lift-up of carrier tape 200 by lift-up device 500 described above is performed so that the lowermost portion of carrier tape 200 is positioned above the upper edges of conveyance side walls 315b, 315c of conveyance member 315. Therefore, after the lift-up described above, when carrier tape 200 is conveyed out in orthogonal direction Y different from the tape longitudinal direction by transfer device 400, it is possible to prevent carrier tape 200 being interfered with and getting caught by structures surrounding conveyance path 311 (e.g., sprocket 312 and conveyance side wall 315c of conveyance member 315). In particular, even if carrier tape 200 is of a type such as an embossed type that tends to cause loosening, carrier tape 200 can be prevented from getting caught. Therefore, conveying out of carrier tape 200 from tape leading-end processing device 300 in orthogonal direction Y can be reliably performed without damaging carrier tape 200.

Lifting mechanism 510 of lift-up device 500 is also coupled to abutting member 321 of guide device 320. Abutting member 321 is a portion that comes in contact with the top surface of carrier tape 200 conveyed along conveyance path 311 to guide carrier tape 200 and can be lifted and lowered removably to conveyance floor 315a of conveyance member 315 by air cylinder 322. Accordingly, lifting mechanism 510 for lifting carrier tape 200 can be lifted and lowered using an existing air cylinder 322 without using a lifting device such as a dedicated air cylinder. Therefore, while minimizing the cost increase, it is possible to prevent carrier tape 200, conveyed out in orthogonal direction Y from tape leading-end processing device 300, from getting caught on structures of carrier tape 200.

In the above embodiment, as lift-up device 500, lifting mechanism 510, for directly contacting and lifting up carrier tape 200, and air supply device 520, for lifting carrier tape 200 by utilizing the pressure difference between the upper and lower spaces with carrier tape 200 interposed therebetween, are both provided. However, the present disclosure is not limited to this, and may be applied to any one of lifting mechanism 510 and air supply device 520.

Further, in the above embodiment, air supply device 520 is a device for lifting carrier tape 200 by generating a pressure difference in the upper and lower spaces sandwiching carrier tape 200 by supplying positive pressure air to lower space 316 of carrier tape 200. However, the present disclosure is not limited thereto. Air supply device 520 may be a device for lifting carrier tape 200 with air pressure by blowing air directly to the lower face of carrier tape 200.

In the above embodiment, air supply device 520 is disposed downstream in conveyance direction X from conveyance member 315. However, the present disclosure is not limited thereto. Air supply device 520 may be a device that is disposed partway into or upstream in conveyance direction X from conveyance member 315.

Further, in the above embodiment, air supply device 520 is disposed below conveyance path 311, and is a device for supplying positive pressure air to lower space 316 of carrier tape 200. However, the present disclosure is not limited thereto. Air supply device 520 may be disposed above conveyance path 311 and may be a device for supplying negative pressure air to the upper space of carrier tape 200. Even in the configuration of this modification, it is possible to lift carrier tape 200 by the pressure difference between the upper and lower spaces sandwiching carrier tape 200.

In the embodiment described above, lifting mechanism 510 has two lifting portions 512, 513, and lifting portions 512, 513 are provided at positions separated from each other in conveyance direction X and each come in contact with carrier tape 200. However, the present disclosure is not limited thereto. The lifting portions of lifting mechanism 510 may be provided at one location and provided at three or more locations as long as carrier tape 200, whose leading end is formed to have a predetermined shape, is lifted up to a height at which carrier tape 200 does not get caught on the lifting portion when conveyed out in orthogonal direction Y.

Note that the present disclosure is not limited to the above-described embodiments and modifications, and various changes can be made without departing from the spirit of the present disclosure.

REFERENCE SIGNS LIST

1: Tape autoloading device, 2: Base, 10: Feeder holding stand, 20: Automatic tape processing device, 100: Tape feeder, 200: Carrier tape, 210: Base tape, 211: Accommodation hole, 220: Cover tape, 250: Temporary tape, 300: Tape leading-end processing device, 310: Feeding device, 316: Lower space, 320: Guide device, 340: Peeling device, 350: Cutting device, 351: Cutter, 360: Duct, 400: Transfer device, 401: Guide, 402: Driving roller, 403: Driven roller, 406: Pedestal, 407: Rail, 408: Horizontal-moving air cylinder, 500: Lift-up device, 510: Lifting mechanism, 512: First lifting portion, 513: Second lifting portion, 520: Air supply device.

The invention claimed is:
1. A tape autoloading device, comprising: a tape leading-end processing device configured to form the leading end of a carrier tape into a predetermined shape, the carrier tape comprising a base tape, provided with accommodation holes configured to contain components, and a cover tape, configured to adhere to the top face of the base tape;
and a transfer device configured to convey out the carrier tape in a first direction different from the tape longitu- dinal direction and transfer the carrier tape to a next step, the carrier tape having a leading end formed into the predetermined shape;

wherein the tape leading-end processing device further comprises:

a feeding device configured to convey the carrier tape along a conveyance path, formed as a groove in a guide member, extending in a straight line from a tape inlet to a predetermined processing position;

a pressing device configured to press on the top face of the carrier tape conveyed along the conveyance path; and a cutting device configured to cut the leading end of the carrier tape conveyed along the conveyance path;

wherein the transfer device comprises:

a guide device configured to guide the carrier tape whose leading end is formed into the predetermined shape;

a gripping device configured to grip the leading end of the carrier tape guided by the guide device; and a moving device configured to move the carrier tape, the leading end of which being gripped by the gripping device, in the first direction; and wherein the tape autoloading device comprises a lift-up device which is configured to lift up the carrier tape above the upper edge of the side walls of the guide member, the carrier tape extending along the conveyance path and being lifted up before moving to the first direction by the moving device, and wherein the lift-up device has an air supply device that performs lift-up by way of a pressure difference between the upper and lower spaces sandwiching the carrier tape extending along the conveyance path.

2. The tape autoloading device of claim 1, wherein the lift-up device comprises a lifting mechanism capable of lifting/lowering and configured to lift up the carrier tape extending along the conveyance path by directly abutting the carrier tape.

3. The tape autoloading device of claim 2, wherein the pressing device is a device capable of ascending/descending and is configured to come close to the guide member when conveying the carrier tape along the conveyance path of the carrier tape and separates from the guide member when the carrier tape moves in the first direction; and the lifting mechanism moves up and down in conjunction with the ascending/descending of the pressing device.

4. The tape autoloading device of claim 2, wherein the lifting mechanism has a first lifting portion that abuts on the carrier tape at a position downstream in the conveyance direction from the guide member.

5. The tape autoloading device of claim 2, wherein the lifting mechanism has a second lifting portion that abuts the carrier tape at a position partway into the guide member in the conveyance direction.

6. The tape autoloading device of claim 2, wherein the lifting mechanism has multiple lifting portions which are provided in the guide member at positions spaced apart from each other in the conveyance direction, and each lifting portion abuts the carrier tape.

7. The tape autoloading device of claim 1, wherein the air supply device supplies air to a region of the guide member where the conveyance path is provided.

8. The tape autoloading device of claim 7, wherein the air supply device supplies positive pressure air to a lower space formed below the carrier tape extending along the conveyance path.

9. The tape autoloading device of claim 8, wherein the cutting device has a blade capable of lifted/lowered to contact and cut the leading end of the carrier tape in the lifted position, and the air supply device supplies positive pressure air toward the lifted position when the blade is in the lowered position after cutting.

10. The tape autoloading device of claim 1, wherein the air supply device is disposed downstream in the conveyance direction from the guide member.

11. The tape autoloading device of claim 1, wherein the air supply device is disposed in a duct for discharging cutting components cut by the cutting device.

* * * * *